US012763603B2

(12) United States Patent
Kim et al.

(10) Patent No.: US 12,763,603 B2
(45) Date of Patent: Oct. 13, 2026

(54) ELECTRONIC DEVICE HAVING WIRELESS CHARGING FUNCTION

(71) Applicant: SAMSUNG ELECTRONICS CO., LTD., Suwon-si (KR)

(72) Inventors: Younghwa Kim, Suwon-si (KR); Kyungsub Kim, Suwon-si (KR); Dowan Kim, Suwon-si (KR); Sangseob Kim, Suwon-si (KR); Dongmyeong Park, Suwon-si (KR); Hankook Bae, Suwon-si (KR); Myeongkyu Lee, Suwon-si (KR); Jungki Choi, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 793 days.

(21) Appl. No.: 18/103,837

(22) Filed: Jan. 31, 2023

(65) Prior Publication Data

US 2023/0179020 A1 Jun. 8, 2023

Related U.S. Application Data

(63) Continuation of application No. PCT/KR2021/009802, filed on Jul. 28, 2021.

(30) Foreign Application Priority Data

Jul. 31, 2020 (KR) ........................ 10-2020-0096068

(51) Int. Cl.
*H02J 7/00* (2026.01)
*H02J 7/14* (2006.01)
(Continued)

(52) U.S. Cl.
CPC .............. *H02J 50/005* (2020.01); *H04B 5/24* (2024.01); *H04B 5/79* (2024.01); *H05K 1/0393* (2013.01); *H02J 2207/10* (2020.01)

(58) Field of Classification Search
CPC .......... H02J 50/005; H02J 50/402; H02J 7/00; H04B 5/79; H04B 5/24
(Continued)

(56) References Cited

U.S. PATENT DOCUMENTS 10,629,366 B2 * 4/2020 Lee ........................... B32B 7/06
12,456,880 B1 * 10/2025 Li ........................... H02J 7/751
(Continued)

FOREIGN PATENT DOCUMENTS

KR 10-2018-0010010 1/2018
KR 20180120048 A 5/2018
(Continued)

OTHER PUBLICATIONS

Korean Office Action issued Nov. 21, 2024 in corresponding Korean Patent Application No. 10-2020-0096068.
(Continued)

*Primary Examiner* — Alexis B Pacheco
(74) *Attorney, Agent, or Firm* — Nixon & Vanderhye P.C.

(57) ABSTRACT

A wirelessly chargeable electronic device according to various embodiments may comprise: a first circuit board; a second circuit board; a battery; a flexible printed circuit board (FPCB) electrically connecting the first circuit board and the second circuit board to each other; and a wireless charging antenna stacked on the FPBC, wherein at least a part of the FPBC is arranged overlap in the width range of a pattern of the wireless charging antenna.

15 Claims, 16 Drawing Sheets

(51) Int. Cl.

| | |
|---|---|
| ***H02J 50/00*** | (2016.01) |
| ***H04B 5/24*** | (2024.01) |
| ***H04B 5/79*** | (2024.01) |
| ***H05K 1/03*** | (2006.01) |

(58) Field of Classification Search
USPC ........................................................ 320/132
See application file for complete search history.

(56) References Cited

U.S. PATENT DOCUMENTS

| | | | | |
|---|---|---|---|---|
| 2008/0164840 | A1* | 7/2008 | Kato | H01F 38/14 336/200 |
| 2013/0249302 | A1* | 9/2013 | An | H01F 27/36 307/104 |
| 2015/0077296 | A1* | 3/2015 | An | H02J 50/12 320/108 |
| 2016/0323428 | A1* | 11/2016 | Kim | G06F 1/1626 |
| 2018/0090975 | A1* | 3/2018 | Lee | H01F 38/14 |
| 2019/0386380 | A1 | 12/2019 | Ham et al. | |
| 2019/0386515 | A1 | 12/2019 | Leem | |
| 2020/0251929 | A1* | 8/2020 | Partovi | H02J 50/005 |
| 2020/0303814 | A1 | 9/2020 | Lee et al. | |
| 2020/0343745 | A1* | 10/2020 | Choi | H02J 7/731 |
| 2021/0050742 | A1* | 2/2021 | Callan | H02J 50/402 |
| 2022/0224167 | A1* | 7/2022 | Jang | H01F 38/14 |
| 2023/0179020 | A1* | 6/2023 | Kim | H04B 5/24 320/108 |
| 2023/0275467 | A1* | 8/2023 | Farkas | H02J 50/20 320/108 |

FOREIGN PATENT DOCUMENTS

| | | |
|---|---|---|
| KR | 10-2019-0141474 | 12/2019 |
| KR | 102056262 B1 | 12/2019 |

OTHER PUBLICATIONS

Extended European Search Report dated Dec. 8, 2023 issued in European Patent Application No. 21849981.2.

Korean Notice of Allowance issued Jun. 23, 2025 in corresponding Korean Patent Application No. 10-2020-0096068 and English-language translation.

Indian Office Action dated Jun. 3, 2026 issued in Indian Patent Application No. 202317006049 and English-language translation, 7 pp.

* cited by examiner

ELECTRONIC DEVICE HAVING WIRELESS CHARGING FUNCTION

CROSS-REFERENCE TO RELATED APPLICATIONS

This application is a continuation of International Application No. PCT/KR2021/009802 designating the United States, filed on Jul. 28, 2021, in the Korean Intellectual Property Receiving Office and claiming priority to Korean Patent Application No. 10-2020-0096068, filed on Jul. 31, 2020, in the Korean Intellectual Property Office, the disclosures of which are incorporated by reference herein in their entireties.

BACKGROUND

Field

The disclosure relates to an electronic device including a wireless charging function.

Description of Related Art

An electronic device may perform wireless charging or contact-less charging using a wireless power transfer technology. The wireless power transmission technology may be a technology by which electric power is wirelessly transferred from a power transmission device to a power reception device to charge a battery of the power reception device without connection by an additional connector between the power reception device and the power transmission device. The wireless power transmission technology may include a magnetic induction method and a magnetic resonance method, and various types of other wireless power transmission technologies as well.

An electronic device may include a display and an antenna for wireless charging. The electronic device may include a conductive connection member, for example, a flexible printed circuit board (FPCB) for connecting the display to a printed circuit board included in the electronic device. When viewed from above the display of the electronic device, the antenna and the conductive connection member may partially overlap. A frequency band used for wireless charging may be similar to a frequency band used for transmitting data to the display thereby causing flickering on the display in case that the display is turned on while wireless charging. In the electronic device, wireless charging transmission power may cause coupling noise and the coupling noise may cause flickering on the display of the electronic device.

SUMMARY

Embodiments of the disclosure provide an electronic device including a wireless charging function that may include a structure configured to prevent and/or reduce coupling noise on an FPCB configured to transmit a display signal and/or power.

A wirelessly chargeable electronic device according to various example embodiments may include: a first circuit board; a second circuit board; a battery; a flexible printed circuit board (FPCB) which electrically connects the first circuit board and the second circuit board to each other; and a wireless charging antenna stacked on the FPBC, wherein at least a part of the FPBC is arranged to at least partially overlap in the width range of a pattern of the wireless charging antenna.

The electronic device including a wireless charging function according to various example embodiments may prevent and/or reduce coupling noise on an FPCB configured to transmit a display signal and/or power so as to prevent and/or reduce a flickering phenomenon of the display.

BRIEF DESCRIPTION OF THE DRAWINGS

The above and other aspects, features and advantages of certain embodiments of the present disclosure will be more apparent from the following detailed description, taken in conjunction with the accompanying drawings, in which.

DETAILED DESCRIPTION

Figure 1:
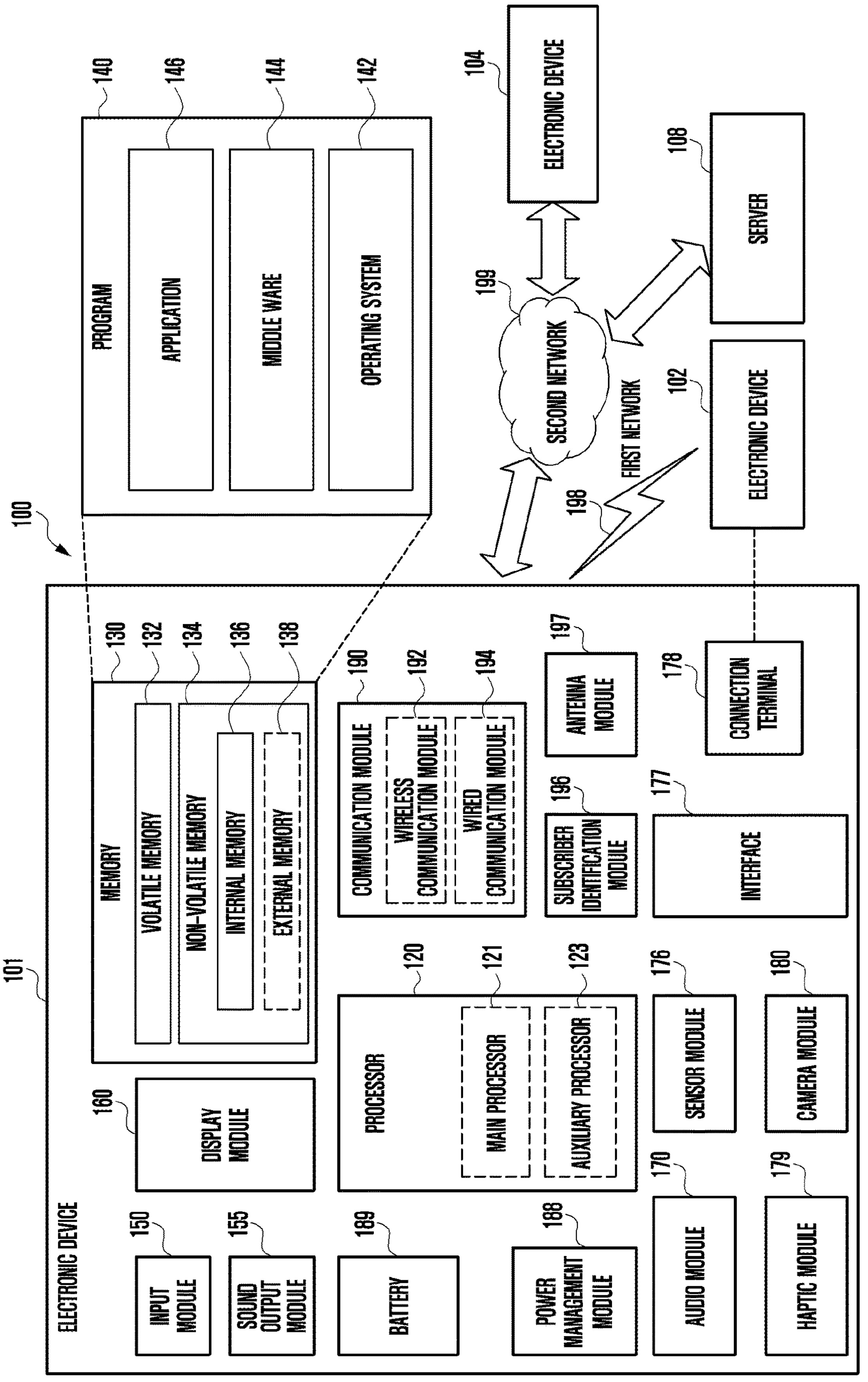
FIG. 1 is a block diagram illustrating an example electronic device receiving wireless power in a network environment according to various embodiments.

FIG. 1 is a block diagram illustrating an electronic device 101 in a network environment 100 according to various embodiments. Referring to FIG. 1, the electronic device 101 in the network environment 100 may communicate with an electronic device 102 via a first network 198 (e.g., a short-range wireless communication network), or at least one of an electronic device 104 or a server 108 via a second network 199 (e.g., a long-range wireless communication network). According to an embodiment, the electronic device 101 may communicate with the electronic device 104 via the server 108. According to an embodiment, the electronic device 101 may include a processor 120, memory 130, an input module 150, a sound output module 155, a display module 160, an audio module 170, a sensor module 176, an interface 177, a connecting terminal 178, a haptic module 179, a camera module 180, a power management module 188, a battery 189, a communication module 190, a subscriber identification module (SIM) 196, or an antenna module 197. In various embodiments, at least one of the components (e.g., the connecting terminal 178) may be omitted from the electronic device 101, or one or more other components may be added in the electronic device 101. In various embodiments, some of the components (e.g., the sensor module 176, the camera module 180, or the antenna module 197) may be implemented as a single component (e.g., the display module 160).

The processor 120 may execute, for example, software (e.g., a program 140) to control at least one other component (e.g., a hardware or software component) of the electronic device 101 coupled with the processor 120, and may perform various data processing or computation. According to an embodiment, as at least part of the data processing or computation, the processor 120 may store a command or data received from another component (e.g., the sensor module 176 or the communication module 190) in volatile memory 132, process the command or the data stored in the volatile memory 132, and store resulting data in non-volatile memory 134. According to an embodiment, the processor 120 may include a main processor 121 (e.g., a central processing unit (CPU) or an application processor (AP)), or an auxiliary processor 123 (e.g., a graphics processing unit (GPU), a neural processing unit (NPU), an image signal processor (ISP), a sensor hub processor, or a communication processor (CP)) that is operable independently from, or in conjunction with, the main processor 121. For example, when the electronic device 101 includes the main processor 121 and the auxiliary processor 123, the auxiliary processor 123 may be adapted to consume less power than the main processor 121, or to be specific to a specified function. The auxiliary processor 123 may be implemented as separate from, or as part of the main processor 121.

The auxiliary processor 123 may control at least some of functions or states related to at least one component (e.g., the display module 160, the sensor module 176, or the communication module 190) among the components of the electronic device 101, instead of the main processor 121 while the main processor 121 is in an inactive (e.g., sleep) state, or together with the main processor 121 while the main processor 121 is in an active state (e.g., executing an application). According to an embodiment, the auxiliary processor 123 (e.g., an image signal processor or a communication processor) may be implemented as part of another component (e.g., the camera module 180 or the communication module 190) functionally related to the auxiliary processor 123. According to an embodiment, the auxiliary processor 123 (e.g., the neural processing unit) may include a hardware structure specified for artificial intelligence model processing. An artificial intelligence model may be generated by machine learning. Such learning may be performed, e.g., by the electronic device 101 where the artificial intelligence is performed or via a separate server (e.g., the server 108). Learning algorithms may include, but are not limited to, e.g., supervised learning, unsupervised learning, semi-supervised learning, or reinforcement learning. The artificial intelligence model may include a plurality of artificial neural network layers. The artificial neural network may be a deep neural network (DNN), a convolutional neural network (CNN), a recurrent neural network (RNN), a restricted boltzmann machine (RBM), a deep belief network (DBN), a bidirectional recurrent deep neural network (BRDNN), deep Q-network or a combination of two or more thereof but is not limited thereto. The artificial intelligence model may, additionally or alternatively, include a software structure other than the hardware structure.

The memory 130 may store various data used by at least one component (e.g., the processor 120 or the sensor module 176) of the electronic device 101. The various data may include, for example, software (e.g., the program 140) and input data or output data for a command related thereto. The memory 130 may include the volatile memory 132 or the non-volatile memory 134.

The program 140 may be stored in the memory 130 as software, and may include, for example, an operating system (OS) 142, middleware 144, or an application 146.

The input module 150 may receive a command or data to be used by another component (e.g., the processor 120) of the electronic device 101, from the outside (e.g., a user) of the electronic device 101. The input module 150 may include, for example, a microphone, a mouse, a keyboard, a key (e.g., a button), or a digital pen (e.g., a stylus pen).

The sound output module 155 may output sound signals to the outside of the electronic device 101. The sound output module 155 may include, for example, a speaker or a receiver. The speaker may be used for general purposes, such as playing multimedia or playing record. The receiver may be used for receiving incoming calls. According to an embodiment, the receiver may be implemented as separate from, or as part of the speaker.

The display module 160 may visually provide information to the outside (e.g., a user) of the electronic device 101. The display module 160 may include, for example, a display, a hologram device, or a projector and control circuitry to control a corresponding one of the display, hologram device, and projector. According to an embodiment, the display module 160 may include a touch sensor adapted to detect a touch, or a pressure sensor adapted to measure the intensity of force incurred by the touch.

The audio module 170 may convert a sound into an electrical signal and vice versa. According to an embodiment, the audio module 170 may obtain the sound via the input module 150, or output the sound via the sound output module 155 or a headphone of an external electronic device (e.g., an electronic device 102) directly (e.g., wiredly) or wirelessly coupled with the electronic device 101.

The sensor module 176 may detect an operational state (e.g., power or temperature) of the electronic device 101 or an environmental state (e.g., a state of a user) external to the electronic device 101, and then generate an electrical signal or data value corresponding to the detected state. According to an embodiment, the sensor module 176 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 177 may support one or more specified protocols to be used for the electronic device 101 to be coupled with the external electronic device (e.g., the electronic device 102) directly (e.g., wiredly) or wirelessly. According to an embodiment, the interface 177 may include, for example, a high definition multimedia interface (HDMI), a universal serial bus (USB) interface, a secure digital (SD) card interface, or an audio interface.

A connecting terminal 178 may include a connector via which the electronic device 101 may be physically connected with the external electronic device (e.g., the electronic device 102). According to an embodiment, the connecting terminal 178 may include, for example, a HDMI connector, a USB connector, a SD card connector, or an audio connector (e.g., a headphone connector).

The haptic module 179 may convert an electrical signal into a mechanical stimulus (e.g., a vibration or a movement) or electrical stimulus which may be recognized by a user via his tactile sensation or kinesthetic sensation. According to an embodiment, the haptic module 179 may include, for example, a motor, a piezoelectric element, or an electric stimulator.

The camera module 180 may capture a still image or moving images. According to an embodiment, the camera module 180 may include one or more lenses, image sensors, image signal processors, or flashes.

The power management module 188 may manage power supplied to the electronic device 101. According to an embodiment, the power management module 188 may be implemented as at least part of, for example, a power management integrated circuit (PMIC).

The battery 189 may supply power to at least one component of the electronic device 101. According to an embodiment, the battery 189 may include, for example, a primary cell which is not rechargeable, a secondary cell which is rechargeable, or a fuel cell.

The communication module 190 may support establishing a direct (e.g., wired) communication channel or a wireless communication channel between the electronic device 101 and the external electronic device (e.g., the electronic device 102, the electronic device 104, or the server 108) and performing communication via the established communication channel. The communication module 190 may include one or more communication processors that are operable independently from the processor 120 (e.g., the application processor (AP)) and supports a direct (e.g., wired) communication or a wireless communication. According to an embodiment, the communication module 190 may include a wireless communication module 192 (e.g., a cellular communication module, a short-range wireless communication module, or a global navigation satellite system (GNSS) communication module) or a wired communication module 194 (e.g., a local area network (LAN) communication module or a power line communication (PLC) module). A corresponding one of these communication modules may communicate with the external electronic device via the first network 198 (e.g., a short-range communication network, such as Bluetooth™ wireless-fidelity (Wi-Fi) direct, or infrared data association (IrDA)) or the second network 199 (e.g., a long-range communication network, such as a legacy cellular network, a 5G network, a next-generation communication network, the Internet, or a computer network (e.g., LAN or wide area network (WAN)). These various types of communication modules may be implemented as a single component (e.g., a single chip), or may be implemented as multi components (e.g., multi chips) separate from each other. The wireless communication module 192 may identify and authenticate the electronic device 101 in a communication network, such as the first network 198 or the second network 199, using subscriber information (e.g., international mobile subscriber identity (IMSI)) stored in the subscriber identification module 196.

The wireless communication module 192 may support a 5G network, after a 4G network, and next-generation communication technology, e.g., new radio (NR) access technology. The NR access technology may support enhanced mobile broadband (eMBB), massive machine type communications (mMTC), or ultra-reliable and low-latency communications (URLLC). The wireless communication module 192 may support a high-frequency band (e.g., the mmWave band) to achieve, e.g., a high data transmission rate. The wireless communication module 192 may support various technologies for securing performance on a high-frequency band, such as, e.g., beamforming, massive multiple-input and multiple-output (massive MIMO), full dimensional MIMO (FD-MIMO), array antenna, analog beam-forming, or large scale antenna. The wireless communication module 192 may support various requirements specified in the electronic device 101, an external electronic device (e.g., the electronic device 104), or a network system (e.g., the second network 199). According to an embodiment, the wireless communication module 192 may support a peak data rate (e.g., 20 Gbps or more) for implementing eMBB, loss coverage (e.g., 164 dB or less) for implementing mMTC, or U-plane latency (e.g., 0.5 ms or less for each of downlink (DL) and uplink (UL), or a round trip of 1 ms or less) for implementing URLLC.

The antenna module 197 may transmit or receive a signal or power to or from the outside (e.g., the external electronic device) of the electronic device 101. According to an embodiment, the antenna module 197 may include an antenna including a radiating element including a conductive material or a conductive pattern formed in or on a substrate (e.g., a printed circuit board (PCB)). According to an embodiment, the antenna module 197 may include a plurality of antennas (e.g., array antennas). In such a case, at least one antenna appropriate for a communication scheme used in the communication network, such as the first network 198 or the second network 199, may be selected, for example, by the communication module 190 (e.g., the wireless communication module 192) from the plurality of antennas. The signal or the power may then be transmitted or received between the communication module 190 and the external electronic device via the selected at least one antenna. According to an embodiment, another component (e.g., a radio frequency integrated circuit (RFIC)) other than the radiating element may be additionally formed as part of the antenna module 197.

According to various embodiments, the antenna module 197 may form a mmWave antenna module. According to an embodiment, the mmWave antenna module may include a printed circuit board, a RFIC disposed on a first surface (e.g., the bottom surface) of the printed circuit board, or adjacent to the first surface and capable of supporting a designated high-frequency band (e.g., the mmWave band), and a plurality of antennas (e.g., array antennas) disposed on a second surface (e.g., the top or a side surface) of the printed circuit board, or adjacent to the second surface and capable of transmitting or receiving signals of the designated high-frequency band.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

According to an embodiment, commands or data may be transmitted or received between the electronic device 101 and the external electronic device 104 via the server 108 coupled with the second network 199. Each of the electronic devices 102 or 104 may be a device of a same type as, or a different type, from the electronic device 101. According to an embodiment, all or some of operations to be executed at the electronic device 101 may be executed at one or more of the external electronic devices 102, 104, or 108. For example, if the electronic device 101 should perform a function or a service automatically, or in response to a request from a user or another device, the electronic device 101, instead of, or in addition to, executing the function or the service, may request the one or more external electronic devices to perform at least part of the function or the service. The one or more external electronic devices receiving the request may perform the at least part of the function or the service requested, or an additional function or an additional service related to the request, and transfer an outcome of the performing to the electronic device 101. The electronic device 101 may provide the outcome, with or without further processing of the outcome, as at least part of a reply to the request. To that end, a cloud computing, distributed computing, mobile edge computing (MEC), or client-server computing technology may be used, for example. The electronic device 101 may provide ultra low-latency services using, e.g., distributed computing or mobile edge computing. In an embodiment, the external electronic device 104 may include an internet-of-things (IoT) device. The server 108 may be an intelligent server using machine learning and/or a neural network. According to an embodiment, the external electronic device 104 or the server 108 may be included in the second network 199. The electronic device 101 may be applied to intelligent services (e.g., smart home, smart city, smart car, or healthcare) based on 5G communication technology or IoT-related technology.

Figure 2:
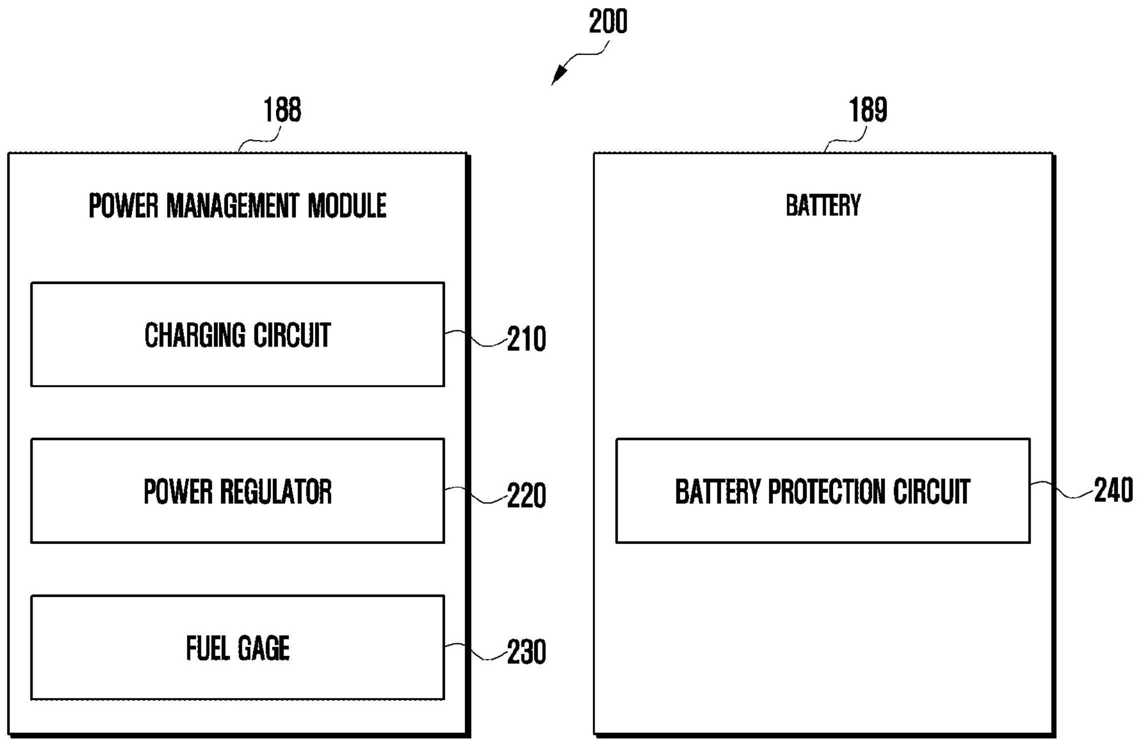
FIG. 2 is a block diagram illustrating an example power management module and a battery according to various embodiments.

FIG. 2 is a block diagram 200 illustrating an example configuration of a power management module 188 and a battery 189 according to various embodiments. Referring to FIG. 2, the power management module 188 may include a charging circuit 210, a power regulator (e.g., including circuitry) 220, and/or a fuel gage 230. The charging circuit 210 may charge the battery 189 using power supplied from an external power source with respect to a first electronic device 101. According to an embodiment, the charging circuit 210 may select a charging scheme (e.g., normal charging or quick charging) based on at least a portion of a type of an external power source (e.g., a power adapter, a USB, or wireless charging), an amount (e.g., about 20 watt or more) of power that may be supplied from the external power source, or attributes of the battery 189, and charge the battery 189 using the selected charging scheme. The external power source may be connected to the first electronic device 101, for example, in a wired manner through a connection terminal 178 or in a wireless manner through an antenna module 197.

The power regulator 220, for example, may include various circuitry and regulate a voltage level or a current level of power supplied from the external power source or the battery 189 so as to generate multiple pieces of power having different voltage or current levels. The power regulator 220 may regulate power of the external power source or the battery 189 to a voltage or current level suitable for each of components of partial components among components included in the first electronic device 101. According to an embodiment, the power regulator 220 may be implemented to have a form of a low drop out (LDO) regulator or a switching regulator.

The fuel gage 230 may include various circuitry and/or executable program instructions and measure usage state information (e.g., a capacity of the battery 189, the number of charging/discharging, a voltage, or a temperature) with respect to the battery 189.

The power management module 188 may determine charge state information (e.g., a lifespan, an overvoltage, an undervoltage, an overcurrent, overcharge, over discharge, overheat, short-circuiting, or swelling) related to charging of the battery 189 based on at least a portion of the measured usage state information using, for example, the charging circuit 210, the voltage regulator 220, or the fuel gage 230. The power management module 188 may determine whether the battery 189 is normal or abnormal, based on at least a portion of the determined charge state information. When it is determined that the state of the battery 189 is abnormal, the power management module 188 may regulate charging (e.g., charging voltage or current reduction, or stop charging) with respect to the battery 189. According to an embodiment, at least some parts of functions of the power management module 188 may be performed by an external control device (e.g., the processor 120).

According to an embodiment, the battery 189 may include a battery protection circuit (a protection circuit module (PCM)) 240. The battery protection circuit 240 may perform one or more of various functions (e.g., prevention-in-advance function) for preventing and/or reducing the battery 189 from performance degradation or damage by a fire. The battery protection circuit 240 may be additionally or alternatively configured as at least a part of a battery management system (BMS) capable of performing various functions including cell balancing, measuring a battery capacity, measuring the number of charging/discharging, measuring a temperature, or measuring a voltage.

According to an embodiment, at least a portion of the usage state information or the charging state information of the battery 189 may be measured using a corresponding sensor (e.g., a temperature sensor) of the sensor module 276, the fuel gage 230, or the power management module 188. According to an embodiment, the corresponding sensor (e.g., a temperature sensor) of the sensor module 176 may be included as a portion of the battery protection circuit 240, or may be disposed near the battery 189 as a separate device.

Figure 3:
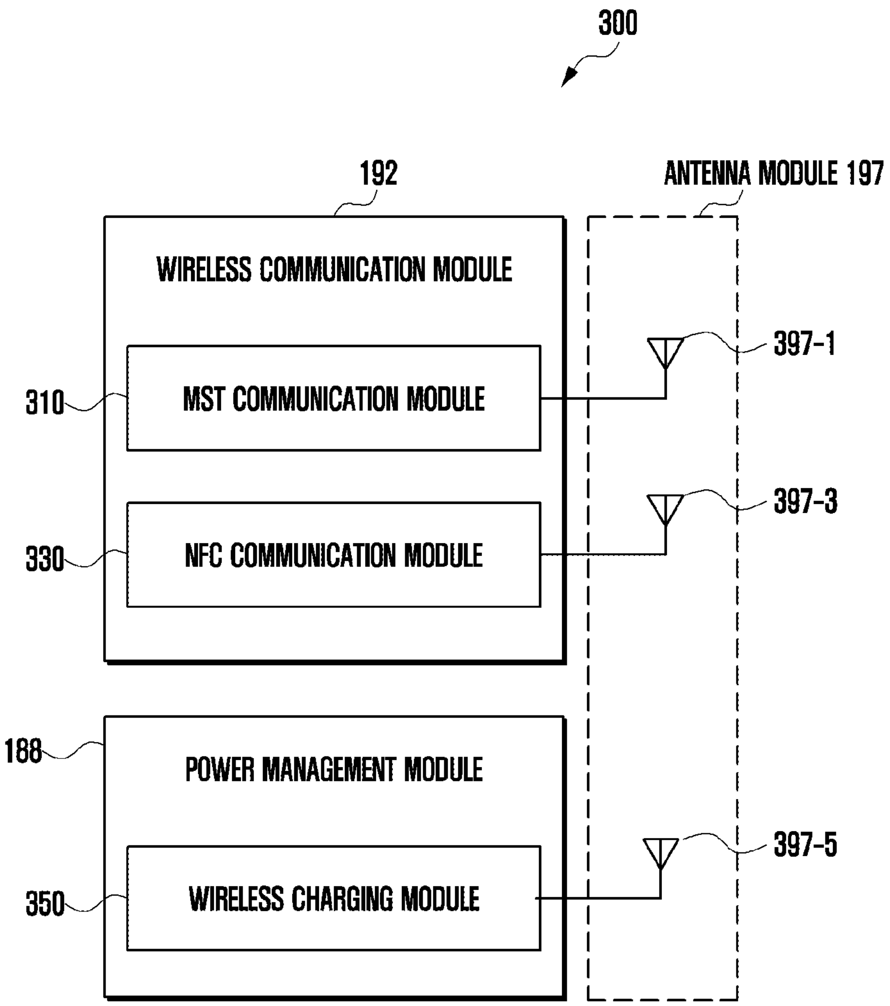
FIG. 3 is a block diagram illustrating an example wireless communication module, a power management module, and an antenna module of an electronic device according to various embodiments.

FIG. 3 is a block diagram 300 illustrating an example configuration of a wireless communication module 192, a power management module 188 and an antenna module 197 of a first electronic device 101 according to various embodiments. Referring to FIG. 3, the wireless communication module 192 may include a magnetic secure transmission (MST) communication module (e.g., including circuitry) 310 and/or a near-filed communication (NFC) communication module (e.g., including circuitry) 330 and the power management module 188 may include a wireless charging module (e.g., including circuitry) 350. In this case, the antenna module 397 may include multiple antennas including an MST antenna 397-1 connected to the MST communication module 310, an NFC antenna 397-3 connected to the NFC communication module 330, and a wireless charging antenna 397-5 connected to the wireless charging module 350. For convenience of description, a component overlapping with those in FIG. 1 are omitted or briefly described.

The MST communication module 310 may include various circuitry and receive a signal including control information or payment information, such as card information, from the processor 120, generate a magnetic signal corresponding to the received signal through the MST antenna 397-1, and then transfer the generated magnetic signal to an external electronic device 102 (e.g., a POS device). In order to generate the magnetic signal, according to an embodiment, the MST communication module 310 may include a switching module (not shown) including one or more switches connected to the MST antenna 397-1, and by controlling the switch module, a direction of a voltage or a current supplied to the MST antenna 397-1 may be changed according to the received signal. The direction change of the voltage or the current may allow a direction of a magnetic signal (e.g., a magnetic field) transmitted through the MST antenna 397-1 to be changed according thereto. In case that the magnetic signal of which the direction is changed is detected by the external electronic device 102, it may cause an effect (e.g., a waveform) similar to a magnetic field generated when a magnetic card corresponding to the receive signal (e.g., card information) is swiped by a card reader of the electronic device 102. According to an embodiment, the payment-related information and a control signal in a form of the magnetic signal received by the electronic device 102 may be transmitted to an external server 108 through, for example, a network 199.

The NFC communication module 330 may include various circuitry and acquire a signal including control information or payment information, such as card information, from the processor 120 and transmit the received signal to the external electronic device 102 through the NFC antenna 397-3. According to an embodiment, the NFC communication module 330 may receive such a signal transmitted from the external electronic device 102 through the NFC antenna 397-3.

The wireless charging module 350 may include various circuitry and wirelessly transmit power to the external electronic device 102 (e.g., a mobile phone or a wearable device) through the wireless charging antenna 397-5 or wirelessly receive power from the external electronic device 102 (e.g., a wireless charging device). For example, the wireless charging module 350 may support one or more of various wireless charging schemes including a magnetic induction scheme and an electromagnetic resonance scheme.

According to an embodiment, some of the MST antenna 397-1, the NFC antenna 397-3, or the wireless charging antenna 397-5 may share at least a part of a radiation part. For example, a radiation part of the MST antenna 397-1 may be used as a radiation part for the NFC antenna 397-3 or the wireless charging antenna 397-5, or vice versa. In this case, the antenna module 397 may include a switching circuit (not shown) configured to selectively connect (e.g., close) or separate (e.g., open) at least part of antennas 397-1, 397-3, and 397-3 according to controlling of the wireless communication module 192 (e.g., the MST communication module 310 or the NFC communication module 330) or the power management module 188 (e.g., the wireless charging module 350). For example, in case that the first electronic device 101 uses a wireless charging function, by controlling the switching circuit, the NFC communication module 330 or the wireless charging module 350 may temporarily separate at least a part of a radiation part shared by the NFC antenna 397-3 and the wireless charging antenna 397-5 from the NFC antenna 397-3 and connect the same to the wireless charging antenna 397-5.

According to an embodiment, at least one function of the MST communication module 310, the NFC communication module 330, or the wireless charging module 350 may be controlled by an external processor (e.g., the processor 120) including various processing circuitry. According to an embodiment, designated functions (e.g., a payment function) of the MST communication module 310 or the NFC communication module 330 may be performed in a trusted execution environment (TEE). The trusted execution environment (TEE) according to various embodiments may form an execution environment to which at least a designated area of the memory 130 is allocated to be used for performing, for example, a function (e.g., a function related to financial transactions or personal information) requiring a relatively high level of security. In this case, access to the designated area may be distinguished and restrictedly permitted according to, for example, a subject accessing the area or an application executed in the trusted execution environment.

Figure 4:
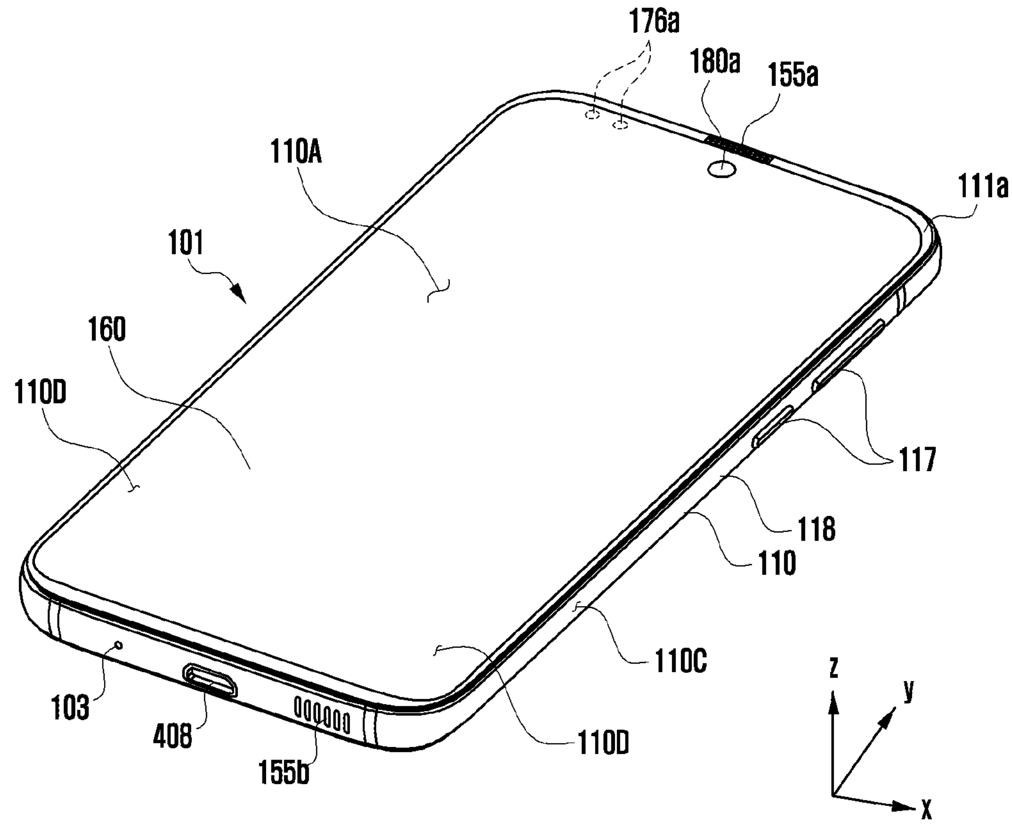
FIG. 4 is a front perspective view of an electronic device according to various embodiments.
Figure 5:
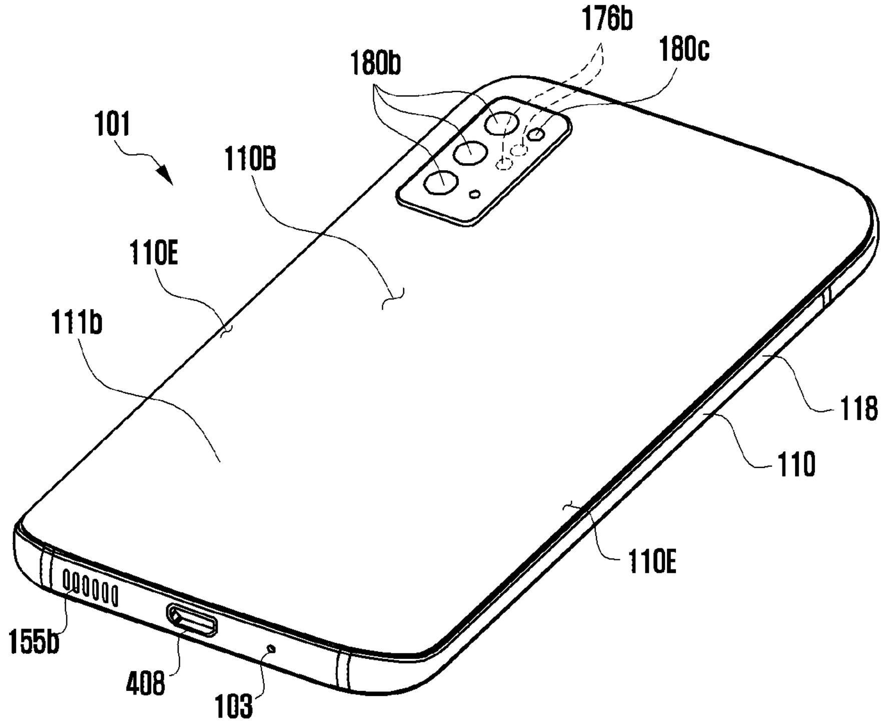
FIG. 5 is a rear perspective view of the electronic device in FIG. 4 according to various embodiments.

FIG. 4 is a front perspective view of an electronic device 101 according to various embodiments. FIG. 5 is a rear perspective view of the electronic device 101 in FIG. 4 according to various embodiments.

Referring to FIG. 4 and FIG. 5, the electronic device 101 according to an embodiment may include a housing 110 including a first surface (or front surface) 110A, a second surface (or rear surface) 110B, and a lateral surface 110C surrounding a space between the first surface 110A and the second surface 110B. According to an embodiment (not shown), the housing may refer to a structure for configuring a portion of the first surface 110A, the second surface 110B, and the lateral surface 110C in FIG. 1. According to an embodiment, at least a portion of the first surface 110A may be formed of substantially transparent front plate 111*a* (e.g., a glass plate including various coating layers or polymer plate). The second surface 110B may be formed of a substantially opaque rear plate 111*b*. The rear plate 111*b* may be formed by, for example, coated or colored glass, ceramic, polymers, metals (e.g., aluminum, stainless steel (STS), or magnesium), or a combination of at least two thereof. The lateral surface 110C may be coupled to the front plate 111*a* and the rear plate 111*b* and formed by a lateral bezel structure 118 (or "lateral member") including a metal and/or polymer. In an embodiment, the rear plate 111*b* and the lateral bezel structure 118 may be integrally formed and include the same material (e.g., a metal material such as aluminum).

In the embodiment illustrated above, the front plate 111*a* may include first area 110D seamlessly extending from the first surface 110A to be bent toward the rear plate at the opposite ends of a long edge of the front plate. In the embodiment illustrated above (see FIG. 2), the rear plate 111*b* may include second area 110E seamlessly extending from the second surface 110B to be bent toward the front plate at the opposite ends of the long edge. In an embodiment, the front plate 111*a* or the rear plate 111*b* may include only one of the first areas 110D or the second areas 110E. In an embodiment, the front plate 111*a* may not include the first area and the second area, but include a flat surface disposed in parallel with the second surface 110B. In the embodiments above, when viewed from a lateral side of the electronic device, the lateral bezel structure 118 may have a first thickness (or width) at a lateral surface in which the first area 110D or the second area 110E is not included, and may have a second thickness thinner than the first thickness at a lateral surface in which the first area or the second area is included.

According to an embodiment, the electronic device 101 may include at least one of a display module 160, an input device 103, an audio output device 155*a* or 155*b*, a sensor module 176*a* or 176*b*, a camera module 180*a*, 180*b*, or 180*c*, a key input device 117, an indicator (not shown), and a connector 408. In an embodiment, the electronic device 101 may omit at least one of components (e.g., a key input device 117 or an indicator) or may additionally include another component.

The display module 160 may be visible through, for example, a substantial portion of the front plate 111*a*. In an embodiment, at least a part of the display module 160 may be visible through the front plate 111*a* configuring the first surface 110A and the first area 110D of the lateral surface 110C. The display module 160 may be combined to or disposed adjacent to a touch sensing circuit, a pressure sensor for measuring a strength (pressure) of a touch, and/or a digitizer for detecting a magnetic field-type stylus pen. In an embodiment, at least a part of the sensor module 176*a* or 176*b* and/or at least a part of the key input device 117 may be disposed on the first area 110D and/or the second area 110E.

The input device 103 may include a microphone 103. In an embodiment, the input device 103 may include multiple microphones 103 arranged so as to detect a direction of a sound. The audio output device 155*a* or 155*b* may include speakers 155*a* and 155*b*. The speakers 155*a* and 155*b* may include an outer speaker 155*b* and a receiver 155*a* for calling. In an embodiment, the microphone 103, the speakers 155*a* and 155*b*, and the connector 408 may be arranged in the space of the electronic device 101 and exposed to the outside environment through at least one hole formed through the housing 110. In an embodiment, a hole formed on the housing 110 may be used in common for the microphone 103 and the speakers 155*a* and 155*b*. In an embodiment, the audio output device 155*a* or 155*b* may include a speaker (e.g., a piezo speaker) operating without a hole formed on the housing 110.

The sensor module 176*a* or 176*b* may generate an electrical signal or a data value corresponding to an internal operation state or external environment state of the electronic device 101. The sensor module 176*a* or 176*b* may include, for example, a first sensor module 176*a* (e.g., a proximity sensor) disposed on the first surface 110A of the housing 110 and/or a second sensor module (not shown) (e.g., a fingerprint sensor), and/or a third sensor module 176*b* (e.g., an HRM sensor) disposed on the second surface 110B of the housing 110. The fingerprint sensor may be disposed on the first surface 110A (e.g., a home key button), on a partial area of the second surface 110B, or under the display module 160 of the housing 110. The electronic device 101 may further include at least one sensor module not shown in the drawings, for example, a gesture sensor, a gyro sensor, an air pressure sensor, a magnetic sensor, an acceleration sensor, a grip sensor, a color sensor, an infrared (IR) sensor, a biometric sensor, a temperature sensor, humidity sensor, or an illuminance sensor 176*a*.

The camera module 180*a*, 180*b*, or 180*c* may include the first camera device 180*a* disposed on the first surface 110A of the electronic device 101 and the second camera device 180*b* disposed on the second surface 110B, and/or a flash 180*c*. The camera modules 180*a* or 180*b* may include one or more of lenses, an image sensor, and/or an image signal processor. The flash 180*c* may include, for example, a light-emitting diode or a xenon lamp. In an embodiment, two or more lenses (wide-angle, super-wide-angle lens, or telephoto lens) and image sensors may be arranged on one surface of the electronic device 101.

The key input device 117 may be disposed on the lateral surface 110C of the housing 110. In an embodiment, the electronic device 101 may not include a portion or entirety of the key input device 117 described above, and the excluded key input device 117 may be implemented as various forms such as a soft key on the display module 160. In an embodiment, the key input device 117 may be implemented using a pressure sensor included in the display module 160.

The indicator may be disposed, for example, on the first surface 110A of the housing 110. The indicator may provide state information of the electronic device 101 in a form of light, for example. In an embodiment, the light-emitting element may provide, for example, a light source associated with an operation of the camera module 180*a*. The indicator may include, for example, a light emitting diode (LED), a infrared LED (IR LED), and a xenon lamp.

The connector hole 408 may include a first connector hole 108 capable of receiving a connector (for example, USB connector) for transmitting or receiving power and/or data to or from an external electronic device, and/or a second connector hole (or an earphone jack) (not shown) capable of receiving a connector for transmitting or receiving an audio signal to or from an external electronic device.

A certain camera module 180*a* of camera modules 180*a* and 180*b*, a certain sensor module 176*a* of sensor modules 176*a* and 176*b*, or the indicator may be disposed to be exposed through the display module 160. By way of example, the camera module 180*a*, the sensor module 176*a*, or the indicator may be disposed in the inner space of the electronic device 101 to be in contact with the external environment through a through-hole extending through the front plate 111*a* of the display module 160. For another example, a certain sensor module 176*a* may be disposed in the inner space of the electronic device to perform functions thereof without visually being exposed through the front plate 111*a*. For example, in this case, a through-hole of the display module 160, facing the sensor module may be unnecessary.

Figure 6:
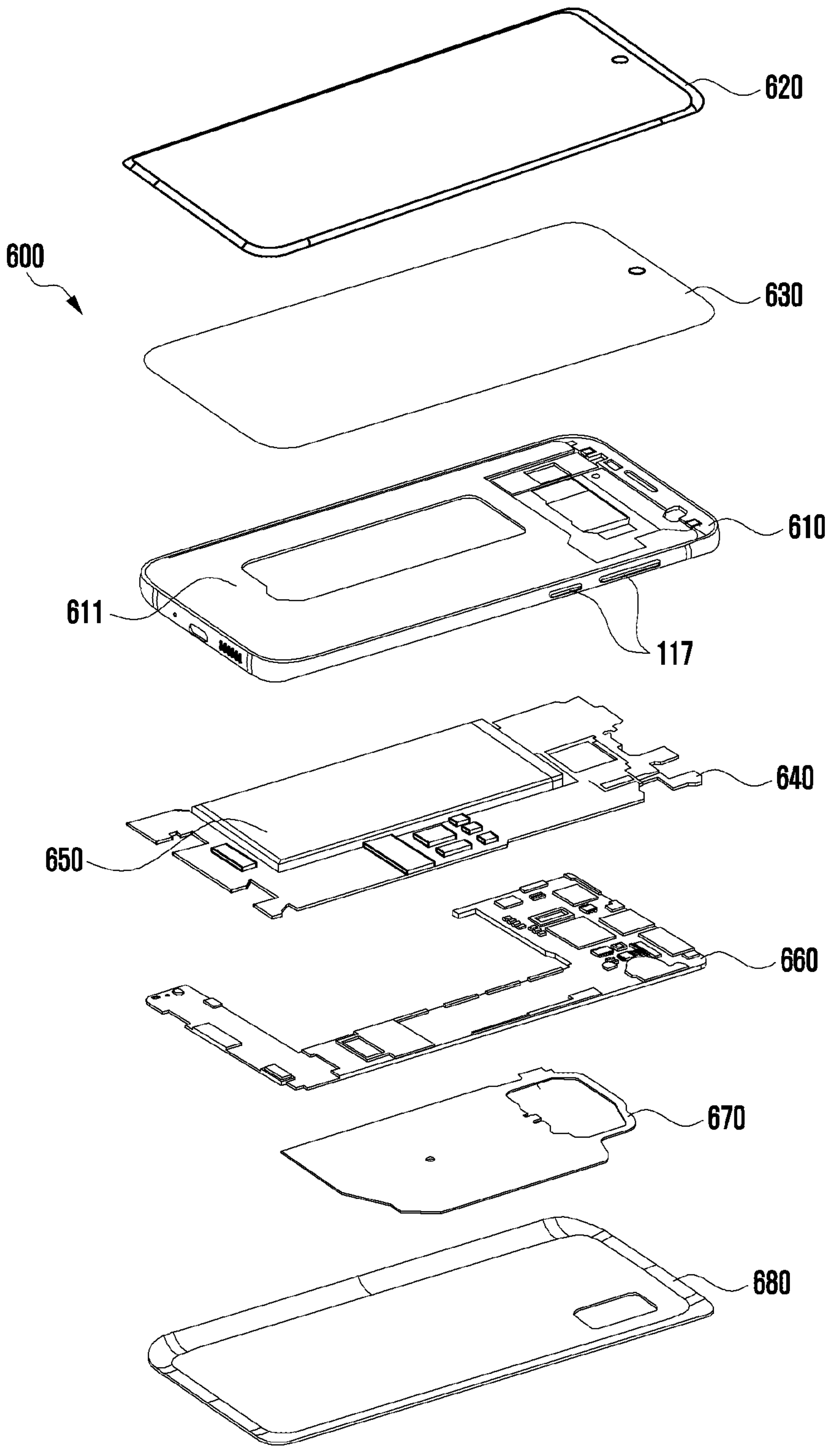
FIG. 6 is an exploded perspective view of the electronic device in FIG. 4 according to various embodiments.

FIG. 6 is an exploded perspective view of the electronic device 101 in FIG. 4 according to various embodiments.

The electronic device 600 In FIG. 6 may be at least partially similar to the electronic device 101 in FIG. 4 and FIG. 5 or may include an example embodiment of an electronic device.

Referring to FIG. 6, the electronic device 600 (e.g., the electronic device 101 in FIG. 4 or FIG. 5) may include a lateral member 610 (e.g., a lateral bezel structure), a first support member 611 (e.g., a bracket or support structure), a front plate 620 (e.g., a front cover), a display 630, a printed circuit board 640, a battery 650, a second support member 660 (e.g., a rear case), an antenna 670, and a rear plate 680 (e.g., a rear cover). In an embodiment, the electronic device 600 may omit at least one of the components (e.g., the first support member 611 or the second support member 660) or additionally include another component. At least one of the components of the electronic device 600 may be the same as or similar to at least one of the components of the electronic device 101 in FIG. 4 or FIG. 5, and thus the overlapping description thereof will be omitted.

The first support member 611 may be disposed in the electronic device 600 to be connected to the lateral structure 610 or integrally formed with the lateral structure 610. The first support member 611 may be formed of, for example, a metal material and/or a non-metal (e.g., a polymer) material. The first support member 611 may have the display 630 coupled to one surface thereof and the printed circuit board 640 coupled to the other surface thereof. A processor, a memory, and/or an interface may be mounted on the printed circuit board 640. The processor may include one or more of, for example, a central processing unit, an application processor, a graphic processing device, an image signal processor, a sensor herb processor, or a communication processor. The memory may include, for example, a transitory memory or a non-transitory memory.

The interface may include, for example, a high-definition multimedia interface (HDMI), a universal serial bus (USB) interface, a SD card interface, and/or an audio interface. The interface may electrically or physically connect the electronic device 600 to an external electronic device, and may include, for example, a USB connector, SD card/MMC connector, or an audio connector.

The battery 650 is a device for supplying power to at least one component of the electronic device 600, and may include, for example, a non-rechargeable primary battery, or a rechargeable secondary battery, or a fuel cell. At least a part of the battery 650 may be disposed, for example, on a substantially identical plane to the printed circuit board 640. The battery 650 may be integrally disposed inside the electronic device 600. In another example, the battery 650 may be disposed to be attachable to/detachable from the electronic device 600.

The antenna 670 may be interposed between the rear plate 680 and the battery 650. The antenna 670 may include, for example, a near field communication (NFC) antenna, a wireless charging antenna (e.g., the wireless charging antenna 397-5 in FIG. 3), and/or a magnetic secure transmission (MST) antenna. The antenna 670 may wirelessly transmit and receive power required for charging or perform near field communication with an external device, for example. In an embodiment, an antenna structure may be formed by a part of a combination of the lateral bezel structure 610 and/or the first support member 611.

Figure 7A:
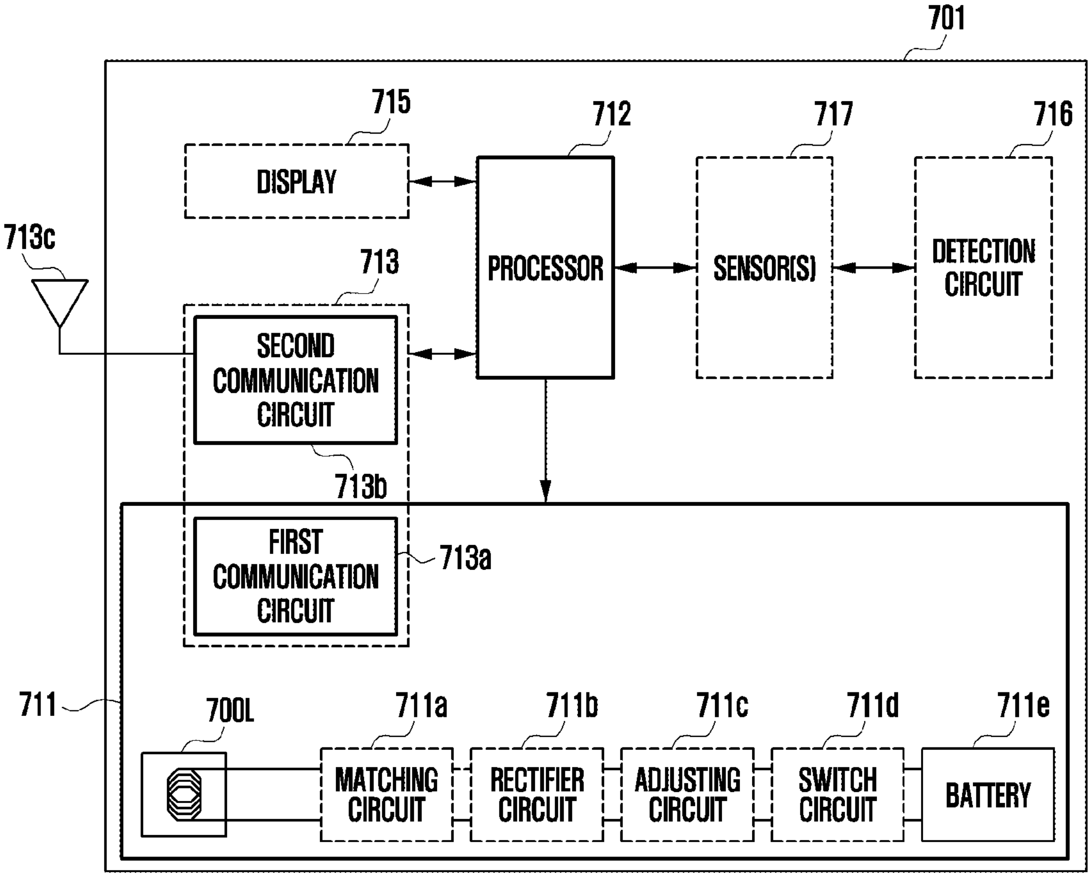
FIG. 7A is a block diagram illustrating an example configuration of a first electronic device according to various embodiments.

FIG. 7A is a block diagram illustrating an example configuration of a first electronic device 701 (e.g., the first electronic device 101 in FIG. 1) according to various embodiments.

Figure 7B:
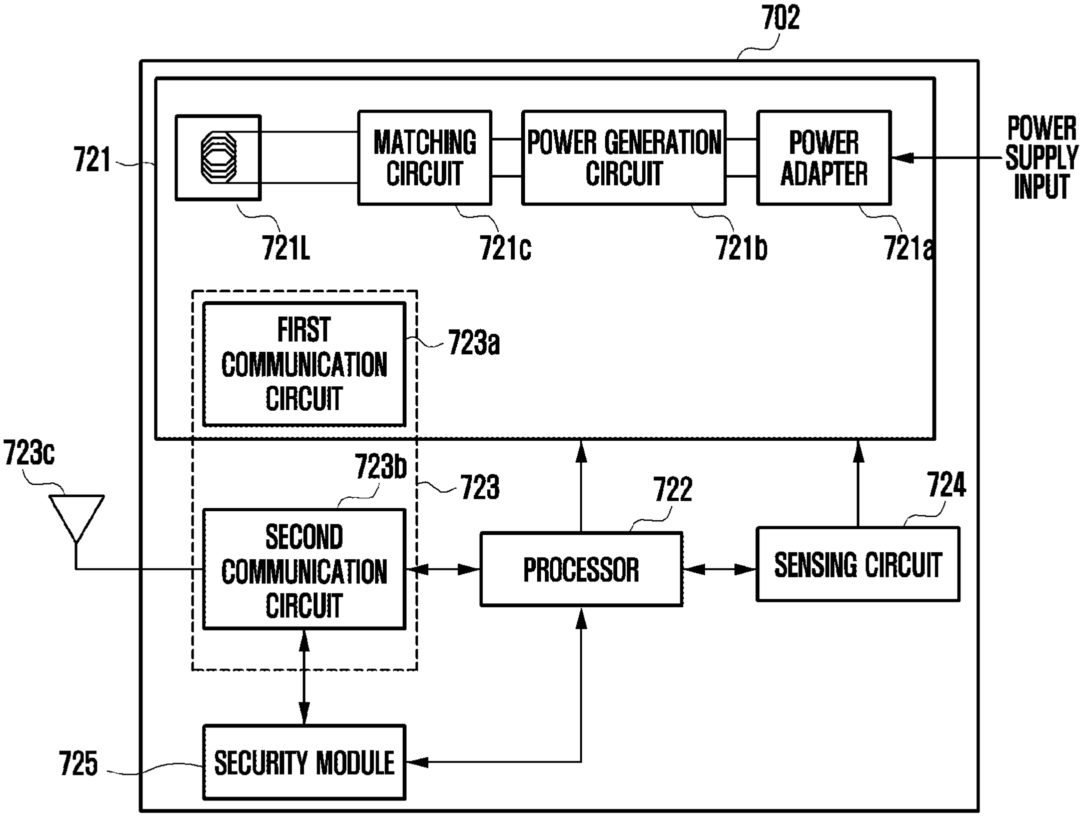
FIG. 7B is a block diagram illustrating an example configuration of a second electronic device according to various embodiments.

FIG. 7B is a block diagram illustrating an example configuration of a second electronic device 702 (e.g., the electronic device 102 in FIG. 1) according to various embodiments.

According to various embodiments, referring to FIG. 7A and FIG. 7B, the second electronic device 702 (e.g., the electronic device 102 in FIG. 1) (hereinafter, also referred to as a power transmission device) may wirelessly supply power to the first electronic device 701 (e.g., the first electronic device 101 in FIG. 1) (hereinafter, also referred to as a power reception device) and the first electronic device 701 may wireless receive power. Roles of the first electronic device 701 and the second electronic device 701 in wireless charging are not limited to FIG. 7A and FIG. 7B and an opposite case may be possible. For example, the second electronic device 702 (e.g., a smartphone) may function as a power reception device and the first electronic device 701 (e.g., a smartphone) may function as a power transmission device.

According to various embodiments, the first electronic device 701 (e.g., the electronic device 101 in FIG. 1) may include a power reception circuit 711, a processor (e.g., including processing circuitry) 712 (e.g., the processor 120 in FIG. 1), a communication circuit 713 (e.g., the communication module 190 in FIG. 1), at least one sensor 717 (e.g., the sensor module 176 in FIG. 1), a display 715 (e.g., the display module 160 in FIG. 1), and/or a detection circuit 716. As for the first electronic device 701, a description of a component corresponding to the second electronic device 702 (e.g., the electronic device 102 in FIG. 1) may be partially omitted.

According to various embodiments, the power reception circuit 711 may include a reception coil 700L for wirelessly receiving power from the second electronic device 702, a matching circuit 711*a*, a rectifier circuit 711*b* for rectifying received AC power to DC, an adjusting circuit 711*c* for adjusting a charging voltage, a switching circuit 711*d*, and/or a battery 711*e* (e.g., the battery 189 in FIG. 1). For example, at least a part of the reception circuit 711 may be included in the receiver circuit. The rectifier circuit 711*b*, the adjusting circuit 711*c*, and/or the switching circuit 711*d* included in the power reception circuit 711 may be included in a reception circuit (e.g., a wireless charging reception circuit).

According to various embodiments, the communication circuit 713 may include at least one of a first communication circuit 713*a* and a second communication circuit 713*b*. The first communication circuit 713*a* may perform communication with the second electronic device 702 (e.g., the electronic device 102 in FIG. 1) through the reception coil 700L. The second communication circuit 713*b* may perform communication with the second electronic device 702 using at least one of various short-range communication method such as Bluetooth, Bluetooth low energy (BLE), WI-FI, WI-FI Direct, or near field communication (NFC). The second communication circuit 713*b* may include an antenna 713*c* capable of performing communication with an external electronic device (e.g., the first electronic device 701 (the electronic device 101 in FIG. 1)). For example, the communication circuit 713 may be included in a reception circuit (a receiver integrated circuit (RxIC)).

According to various embodiments, the first communication circuit 713*a* may perform communication with the first communication circuit 723*a* of the second electronic device 702 (the electronic device 102 in FIG. 1) using, for example, a frequency band identical to a power signal frequency in the coil 700L or an adjacent frequency band (e.g., an in-band scheme). As for the first communication circuit 713*a*, for example, the first communication circuit 723*a* of the second electronic device 702 and the first communication circuit 713*a* of the first electronic device 701 may perform communication in an in-band scheme. The first communication circuit 713*a* of the first electronic device 701 may perform communication with the second electronic device 702 using the reception coil 700L for receiving power from the second electronic device 702 (the electronic device 102 in FIG. 1). The first electronic device 701 and the second electronic device 702 may perform communication using coils 700L and 721L for transmitting/receiving power.

According to various embodiments, in case of receiving a signal or power transmitted from the second electronic device 702 (the electronic device 102 in FIG. 1) through the coil 700L, the first electronic device 701 (the electronic device 101 in FIG. 1) may control the communication circuit 713 to generate power information or device information of the first electronic device 701 (the electronic device 101 in FIG. 1) to be transmitted to the second electronic device 702 (the electronic device 102 in FIG. 1). The generated power information may be transferred to the second electronic device 702 (the electronic device 102 in FIG. 1) through the coil 700L. For another example, the generated power information may be transferred to the second electronic device 702 (the electronic device 102 in FIG. 1) through a separated antenna. For example, the power information may be information (e.g., reception power, voltage, or current state) related to a charging history of the first electronic device 701 (the electronic device 101 in FIG. 1) or may include output power, output voltage information, charging current information, or information related thereto of the second electronic device 702 (the electronic device 102 in FIG. 1). For example, the power information may include information requiring a transmission power change of the second electronic device 702 (the electronic device 102 in FIG. 1).

According to various embodiments, the first electronic device 701 (the electronic device 101 in FIG. 1) may charge the battery 711*e* through a charging circuit (e.g., the charging circuit 210 in FIG. 2) using power received from the power transmission circuit 721 through the power reception circuit 711. In case that a magnetic field is formed on the coil 721L of the second electronic device 702 (the electronic device 102 in FIG. 1), a current may flow on the coil 700L of the first electronic device 701 (the electronic device 101 in FIG. 1) due to electromagnetic induction or resonance and the battery 711*e* is charged through the charging circuit using the current.

According to various embodiments, the detection circuit 716 may detect that the first electronic device 701 (the electronic device 101 in FIG. 1) is detached from the second electronic device 702. For example, the detection circuit 716 may include at least one of a hardware-type detachment detection circuit or a software-type detachment detection algorithm. For example, even if a detachment detection circuit is not included in the manufacturing process, the first electronic device 701 (the electronic device 101 in FIG. 1) may perform update related to a detachment detection function through software update and use the detection circuit 716.

According to various embodiments, the detection circuit 716 may detect a search signal or power received from the second electronic device 702 (the electronic device 102 in FIG. 1) and detect the second electronic device 702 (the electronic device 102 in FIG. 1). The detection circuit 716 may detect signal change at an input/output terminal of the coil 700L, the matching circuit 711*a*, or the rectifier circuit 711*b*, which is generated by a signal output from the second electronic device 702 (the electronic device 102 in FIG. 1). The detection circuit 716 may acquire information related to movement of the first electronic device 701 (the electronic device 101 in FIG. 1). The detection circuit 716 may acquire information related to a temperature from the at least one sensor 717 (e.g., a temperature sensor or a heart rate monitor (HRM) sensor). For example, the detection circuit 716 may be included in a reception circuit (a receiver integrated circuit (RxIC)).

According to various embodiments, the display 715 may display various information used for wireless power transmission/reception.

According to various embodiments, the at least one sensor 717 may include at least a part of a current/voltage sensor, a temperature sensor, an illuminance sensor, or a sound sensor. The temperature sensor may measure a temperature of the battery 711*e*.

According to various embodiments, the processor 712 may include various processing circuitry and determine charging control based on a time-dependent temperature change of the battery 711*e* measure by the temperature sensor or the inside of the first electronic device 701 (the electronic device 101 in FIG. 1).

According to various embodiments, the processor 712 may perform overall control of the first electronic device 701 (the electronic device 101 in FIG. 1) and generate various messages required for wireless power transmission and transfer the messages to the communication circuit 713.

According to various embodiments, the processor 712 may control to charge the battery 771*e* through the charging circuit (e.g., the charging circuit 210 in FIG. 2) using power received from the second electronic device 702 (the electronic device 102 in FIG. 1) through the power reception circuit 711. The processor 712 may identify situation information associated with an operation of charging the battery 711*e* while the battery 711*e* is charged. For example, the situation information associated with the operation of charging the battery 711*e* may include at least one of information related to a fully-charged state of the battery 711*e* based on a capacity of the battery 711*e*, information related to whether the battery 711*e* is abnormal, for example, a swelling state, or a heat generation state of the first electronic device 701 (the electronic device 101 in FIG. 1).

According to various embodiments, the processor 712 may transmit, based on situation information related to the operation of charging the battery 711*e*, a signal corresponding to power output stop to the second electronic device 702 (the electronic device 102 in FIG. 1) so that the second electronic device 702 (the electronic device 102 in FIG. 1) stops an operation of wirelessly outputting power. For example, in case of determining that the first electronic device 701 (the electronic device 101 in FIG. 1) is in at least one of a state above a predetermined (e.g., specified) temperature or a fully-charged state, a the processor 712 may control to transmit a signal corresponding to power output stop to the second electronic device 702 (the electronic device 102 in FIG. 1) so that the second electronic device 702 (the electronic device 102 in FIG. 1) stops an operation of wirelessly outputting power.

According to various embodiments, the processor 712 may control the power reception circuit 711 so that the second electronic device 702 (the electronic device 102 in FIG. 1) does not receive wirelessly output power or control at least a part (e.g., the communication circuit 713, the power reception circuit 711, or the like) of an internal configuration of the first electronic device 701 (the electronic device 101 in FIG. 1) so as not to respond to a signal received from the second electronic device 702 (the electronic device 102 in FIG. 1). For example, the processor 712 may be included in a reception circuit (a receiver integrated circuit (RxIC)).

According to various embodiments, the processor 712 may identify whether at least one of a signal for resuming charging in a state in which power output of the second electronic device 702 (the electronic device 102 in FIG. 1) is stopped or a signal related to a detachment state of the second electronic device 702 (the electronic device 102 in FIG. 1) is detected. For example, in case that a capacity level of the battery 711*e* measured after a predetermined (e.g., specified) time has elapsed in a fully-charged state of the battery 711*e* is less than a configured value or a temperature of the battery 711*e* is less than a configured value, the processor 712 may determine that the signal for resuming charging is detected. However, the disclosure is not limited thereto.

According to various embodiments, in a state in which power output of the second electronic device 702 (the electronic device 102 in FIG. 1) is stopped, the processor 712 may abut thereon and identify (e.g., receive a signal (e.g., ping) related to a detachment state) a state to identify whether power may be received from the second electronic device 702 (the electronic device 102 in FIG. 1) or in case of satisfying a charging resumption condition when identifying the charging resumption condition of the battery 711*e* (e.g., in case that a capacity level of the battery 711*e* measured after a predetermined (e.g., specified) time has elapsed is less than a configured value or a temperature of the battery 711*e* is less than a configured value), may control to charge the battery 711*e* through the charging circuit 210.

According to various embodiments, based on at least one of the signal for resuming charging of the battery 711*e* and the signal related to the detachment state of the first electronic device 701 (the electronic device 101 in FIG. 1) from the second electronic device 702 (the electronic device 102 in FIG. 1), the processor 712 may transmit a signal corresponding to resumption of power output to the second electronic device 702 (the electronic device 102 in FIG. 1) so that the second electronic device 702 (the electronic device 102 in FIG. 1) resumes an operation of wirelessly outputting power. According to an embodiment, in response to reception of the signal corresponding to power output resumption, the processor 712 may receive power transmitted from the second electronic device 702 (the electronic device 102 in FIG. 1).

According to various embodiments, based on at least one of the signal for resuming charging of the battery 711*e* and whether the first electronic device 701 (the electronic device 101 in FIG. 1) is detached from the second electronic device 702 (the electronic device 102 in FIG. 1), the processor 712 may control to respond to a signal or power of the second electronic device 702 (the electronic device 102 in FIG. 1) so that the second electronic device 702 (the electronic device 102 in FIG. 1) resumes an operation of wirelessly outputting power.

According to various embodiments, in case that the detachment of the second electronic device 702 (the electronic device 102 in FIG. 1) is detected through the detection circuit 716, the processor 712 may receive a signal with respect to a state of the detection circuit 716 from the power reception circuit 711. For example, the signal with respect to the state of the detection circuit 716 may include a signal indicating conversion from a low state of the detection circuit 716 (e.g., a state of being attached) to a high state (e.g., a state in which the first electronic device 701 (the electronic device 101 in FIG. 1) is detached from the second electronic device 702 (the electronic device 102 in FIG. 1)).

According to various embodiments, based on the situation information related to the operation of charging the battery 711*e*, the processor 712 may transmit a signal corresponding to deactivation of the power reception circuit 711 to the power reception circuit 711. An operation of deactivating the power reception circuit 711 may include an operation of controlling not to transmit, to the second electronic device 702 (the electronic device 102 in FIG. 1), a response signal with respect to an identification signal for identifying the first electronic device 701 (the electronic device 101 in FIG. 1) received from the second electronic device 702 (the electronic device 102 in FIG. 1).

According to various embodiments, based on at least one of the signal for resuming charging of the battery 711*e* and the signal related to the detachment state of the second electronic device 702 (the electronic device 102 in FIG. 1), the processor 712 may transmit a signal corresponding to activation of the power reception circuit 711 to the power reception circuit 711. Alternatively, an operation of activating the power reception circuit 711 may include an operation of transmitting, to the second electronic device 702 (the electronic device 102 in FIG. 1), a response signal with respect to a power signal received from the second electronic device 702 (the electronic device 102 in FIG. 1).

According to various embodiments, the second electronic device 702 (the electronic device 102 in FIG. 1) may include a power transmission circuit 721, a processor (e.g., including processing circuitry) 722, a communication circuit 723, a sensing circuit 724, and/or a security module (e.g., including various circuitry and/or executable program instructions) 725.

According to various embodiments, the power transmission circuit 721 may include a power adapter 721*a* configured to receive power supply (or power) from the outside and appropriately convert input power supply, a power generation circuit 721*b* configured to generate power, and/or a matching circuit 721*c* configured to improve efficiency between the transmission coil 721L and the reception coil 700L.

According to various embodiments, the power transmission circuit 721 may include at least multiple portions of a power adapter 721*a*, a power generation circuit 721*b*, a transmission coil 721L, or a matching circuit 721*c* in multiple so as to be capable of transmitting power to multiple power reception devices.

According to various embodiments, the power transmission circuit 721 may generate, using the power generation circuit 721*b*, a first signal in a first frequency for providing first power to a first external electronic device (e.g., the first electronic device 101 in FIG. 1) and a second signal in a second frequency band for providing second power to a second external electronic device.

According to various embodiments, the processor 722 may perform overall control of the second electronic device 702 (the electronic device 102 in FIG. 1), and generate various messages required for wireless power transmission and transfer the messages to the communication circuit 723.

According to various embodiments, the processor 722 may calculate power (electric energy) to be transmitted to the first electronic device 701 (the electronic device 101 in FIG. 1) based on information received from the communication circuit 723.

According to various embodiments, the processor 722 may control the power transmission circuit 721 so that power calculated by the transmission coil 721L is transmitted to the first electronic device 701 (the electronic device 101 in FIG. 1).

According to various embodiments, in case of transmitting power to each of the multiple power reception devices, the processor 722 may control the power generation circuit 721*b* to generate a first signal in a first frequency for providing first power to a first external electronic device and a second signal in a second frequency for providing second power to a second external electronic device.

According to various embodiments, the communication circuit 723 may include at least one of a first communication circuit 723*a* and a second communication circuit 723*b*. The first communication circuit 723*a* may perform communication with the first communication circuit 713*a* of the first electronic device 701 (the electronic device 101 in FIG. 1) using, for example, a frequency band identical or adjacent to a frequency used by the transmission coil 721L to transfer power (e.g., an in-band scheme). The first communication circuit 713*a* may perform communication using, for example, the transmission coil 721L configured to transfer power generated by the power generation circuit 721*b* to the first electronic device 701 (the electronic device 101 in FIG. 1).

According to various embodiments, the first communication circuit 723*a* of the second electronic device 702 and the first communication circuit 713*a* of the first electronic device 701 may perform communication in an in-band scheme. The first communication circuit 723*a* of the second electronic device 702 may perform communication with the first electronic device 701 using the transmission coil 721L configured to transfer power to the first electronic device 701 (the electronic device 101 in FIG. 1). The first communication circuit 713*a* of the first electronic device 701 may perform communication with the second electronic device 702 using the reception coil 700L for receiving power from the second electronic device 702 (the electronic device 102 in FIG. 1). The first electronic device 701 and the second electronic device 702 may perform communication using coils 700L and 721L for transmitting/receiving power.

According to various embodiments, the second communication circuit 723*b* may perform communication with the second communication circuit 713*b* of the first electronic device 701 (the electronic device 101 in FIG. 1) (e.g., an out-band scheme) using, for example, a frequency band different from a frequency used for transferring power in the transmission coil 721L. For example, the second communication circuit 723*b* may use at least one of various short-range communication method such as Bluetooth, Bluetooth low energy (BLE), WI-FI, WI-FI Direct, or near field communication (NFC). The second communication circuit 723*b* may include an antenna 723*c* capable of performing communication with an external electronic device (e.g., the first electronic device 701 (the electronic device 101 in FIG. 1)). The processor 722 may acquire information (e.g., Vrec information, Iout information, various packets, messages, and the like) related to a charging state from the communication circuit 723, 723*a*, or 723*b*. The processor 722 may adjust power to be supplied to the first electronic device 701 (the electronic device 101 in FIG. 1) based on information related to the charging state.

According to various embodiments, the security module 725 may include various circuitry and/or executable program instructions and allow data to be encrypted in case that the security module 725 transmits data through the second communication circuit 723*b*.

According to various embodiments, the security module 725 may be used for data encryption in case that the security module 725 transmits data through the second communication circuit 723*b*.

According to various embodiments, the security module 725 may be connected to the processor 722 and/or the second communication circuit 723*b* and transmit/receive data. The security module 725 may perform an authentication process or use data stored in the security module 725 while transmitting/receiving data to/from the processor 722 and/or the second communication circuit 723*b*.

According to various embodiments, the security module 725 may be included in the processor 722 to be realized in an integrated circuit.

According to various embodiments, the processor 722 may allow data to be encrypted in case of transmitting data through the second communication circuit 723*b*. According to various embodiments, the processor 722 may be connected to the second communication circuit 723*b* and transmit/receive data. The processor 722 may perform an authentication process or use data stored in the security module 725 while transmitting/receiving data to/from the second communication circuit 723*b*.

The second electronic device 702 (the electronic device 102 in FIG. 1) may further include a policy manager (not shown) for a communication method or charging policy of the second communication circuit 723*b*.

In various embodiments, the policy manager may identify a power state (e.g., a voltage, a current, and power) of the first electronic device 701 (the electronic device 101 in FIG. 1) having communication connection through the first communication circuit 723*a* or the second communication circuit 723*b* and may change the power state for charging when authentication of the first electronic device 701 (the electronic device 101 in FIG. 1) is completed.

In various embodiments, the processor 722 may identify a power state (e.g., a voltage, a current, or power) of the first electronic device 701 (the electronic device 101 in FIG. 1) having communication connection through the first communication circuit 723*a* or the second communication circuit 723*b* and may change the power state for charging when authentication of the first electronic device 701 (the electronic device 101 in FIG. 1) is completed.

According to various embodiments, the sensing circuit 724 may include at least one sensor and detect at least one state of the second electronic device 702 (the electronic device 102 in FIG. 1) using the at least one sensor.

According to various embodiments, the sensing circuit 724 may include at least one of a temperature sensor, a movement sensor, or a current (or voltage) sensor. For example, the sensing circuit 724 may detect a temperature state of the second electronic device 702 (the electronic device 102 in FIG. 1) using the temperature sensor. For another example, the sensing circuit 724 may detect a movement state of the second electronic device 702 (the electronic device 102 in FIG. 1) using the movement sensor. For still another example, the sensing circuit 724 may detect an output signal state, for example, a current magnitude, a voltage magnitude, or a power magnitude of the second electronic device 702 (the electronic device 102 in FIG. 1) using the current (or voltage) sensor.

According to various embodiments, the current (or voltage) sensor may measure a signal in the power transmission circuit 721. A signal may be measured in at least a part of the transmission coil 721L, the matching circuit 721*c*, or the power generation circuit 721*b*. For example, the current (or voltage) sensor may include a circuit configured to measure a signal at a front terminal of the transmission coil 721L.

According to various embodiments, the sensing circuit 724 may be a circuit for foreign object detection (FOD).

According to various embodiments, the processor 722 may transmit power for charging the battery 711*e* of the first electronic device 701 (the electronic device 101 in FIG. 1) to the first electronic device 701 (the electronic device 101 in FIG. 1).

According to various embodiments, in case that a signal corresponding to power output stop to stop an operation of wirelessly outputting power is received from the first electronic device 701 (the electronic device 101 in FIG. 1), at least based on situation information related to an operation of charging the battery 711*e*, the processor 722 may stop the operation of wirelessly outputting power.

According to various embodiments, the processor 722 may receive a signal corresponding to power output resumption to resume an operation of wirelessly outputting power from the first electronic device 701 (the electronic device 101 in FIG. 1). In response to the reception of the signal corresponding to the power output resumption, the processor 722 may wirelessly output power to be transmitted to the first electronic device 701 (the electronic device 101 in FIG. 1).

According to various embodiments, the second electronic device 702 may further include a battery (not shown). For example, instead of receiving power from the outside, the second electronic device 702 may charge the battery 711*e* of the first electronic device using the battery included in the second electronic device 702.

According to various embodiments, although it is described that components included in the first electronic device 701 and the second electronic device 702 are different, the first electronic device 701 and the second electronic device 702 may include the same components. For another example, the first electronic device 701 and the second electronic device 702 each may include both the power reception circuit 711 and the power transmission circuit 721.

Here, the first electronic device 701 and the second electronic device 702 may charge each other.

Figure 8:
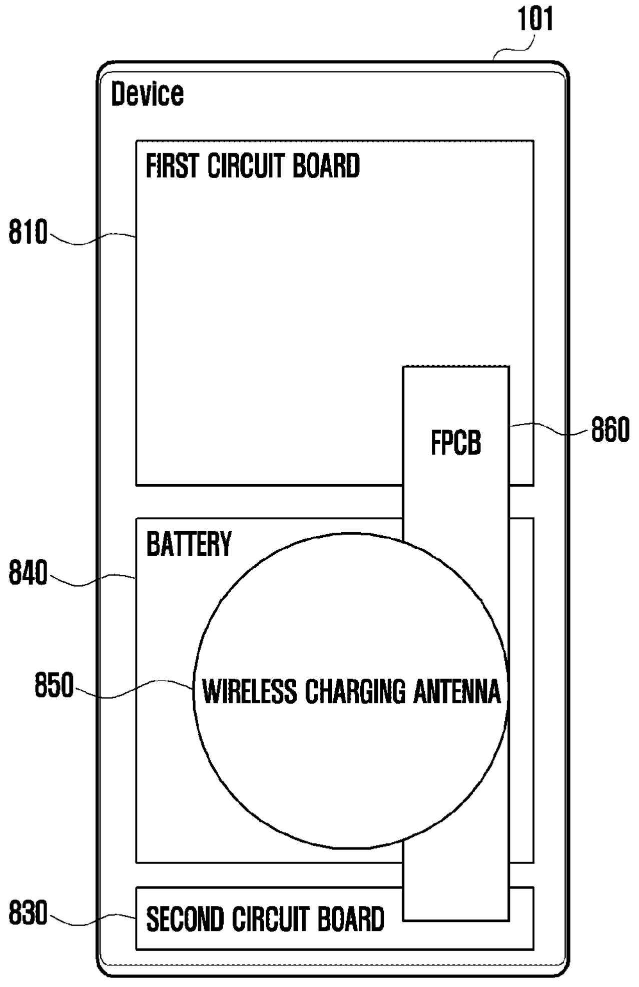
FIG. 8 is a diagram illustrating and internal arrangement of an electronic device according to various embodiments.

FIG. 8 is a diagram illustrating an example internal arrangement of an electronic device 101 according to various embodiments.

Figure 9:
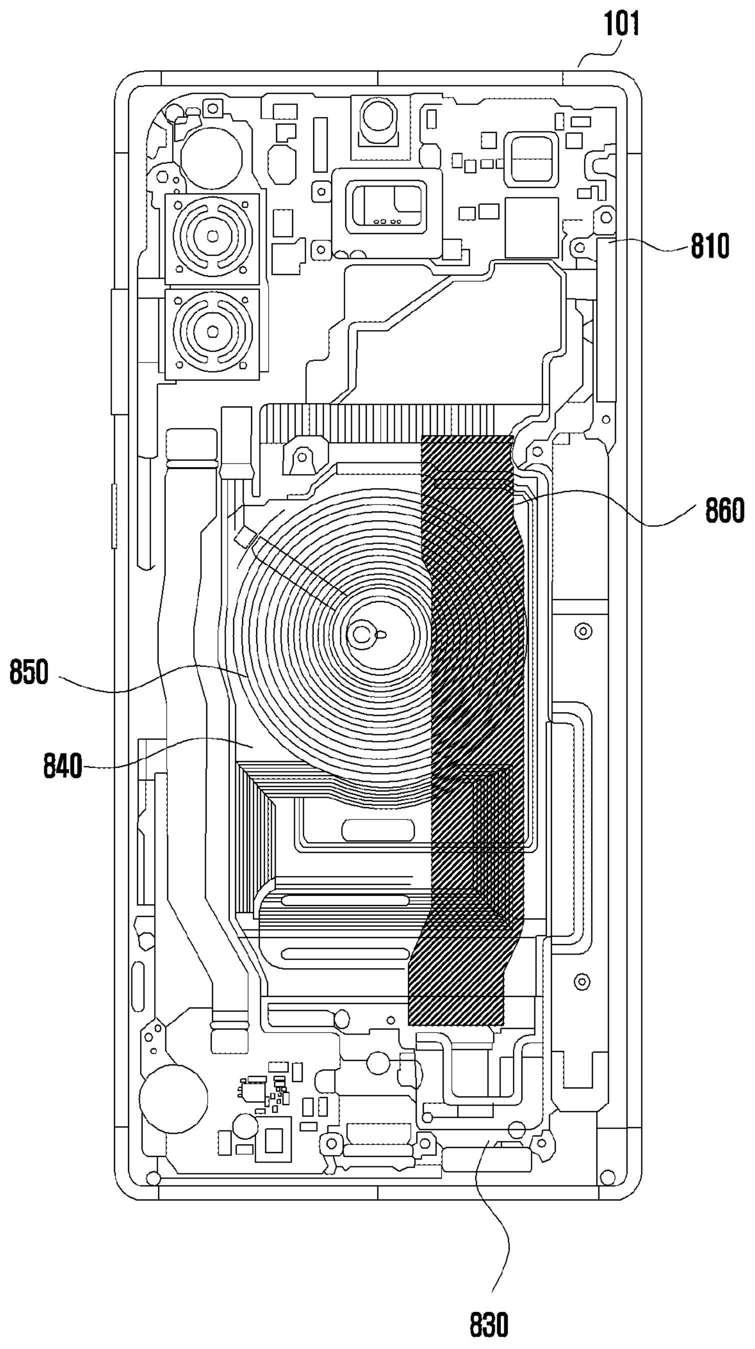
FIG. 9 is a diagram illustrating an internal arrangement of an electronic device according to various embodiments.

FIG. 9 is a diagram illustrating an example internal arrangement of an electronic device 101 according to various embodiments.

Referring to FIG. 8 and FIG. 9, the electronic device 101 may include a first circuit board 810, a second circuit board 830, a battery 840, a wireless charging antenna 850, and/or a flexible printed circuit board (FPCB) 860.

According to various embodiments, the first circuit board 810 may include a processor (the processor 120 in FIG. 1), a communication module (the communication module 190 in FIG. 1), or a memory (the memory 130 in FIG. 1). For example, the first circuit board 810 may be a main board.

According to various embodiments, the second circuit board 820 may include a circuit required for an operation of the display module 160. For example, the second circuit board 820 may be a display PCB.

According to various embodiments, the wireless charging antenna 850 may include the coil 700L in FIG. 7A and/or the transmission coil 721L in FIG. 7B. For example, the wireless charging antenna 850 may transmit/receive power in a frequency band following the wireless power consortium (WPC) standard.

According to various embodiments, the wireless charging antenna 850 may exchange information required for wireless power transmission through in-band communication according to the wireless power consortium (WPC) standard. For example, the in-band communication may be a method by which information may be exchanged between an electronic device 101 and another electronic device (e.g., the second electronic device 402 in FIG. 7B) through frequency or amplitude modulation of a wireless power transmission signal in a situation of wireless power transmission between a coil (e.g., the coil 700L in FIG. 7A) and a coil (e.g., the transmission coil 721L in FIG. 7B). The information may include, for example, an ID (e.g., a model name of identification information of an electronic device) of the electronic device 101 or charging operation mode information (e.g., information about transmitted/received power, voltage, rectification, and information for changing operation mode).

According to various embodiments, the wireless charging antenna 850 may transfer power received from the outside to the battery 840. The battery 840 may store power transferred from the wireless charging antenna 850 and provide required power to the electronic device 101. In an embodiment, the battery 840 may be disposed between the first circuit board 810 and the second circuit board 820. The battery 840 may be substantially the same as, for example, the battery 189 in FIG. 1.

According to various embodiments, the FPCB 860 may electrically connect the first circuit board 810 and the second circuit board 830. When viewed from a rear surface direction (e.g., the rear surface 110*b* in FIG. 5) of the electronic device 101, the FPCB 860 may be disposed to overlap a partial area of the wireless charging antenna 850 and/or the battery 840 disposed between the first circuit board 810 and the second circuit board 830. For example, electric connection included in the FPCB 860 may be made in direction from the first circuit board 810 to the second circuit board 830 and/or from the second circuit board 830 to the first circuit board 810. According to an embodiment, the FPCB 860 may include a power line configured to supply power to the display module 160, a control line configured to transmit a control signal for the display module 160, or a screen signal line configured to transmit a signal related to data to be displayed on the display module 160.

Figure 10:
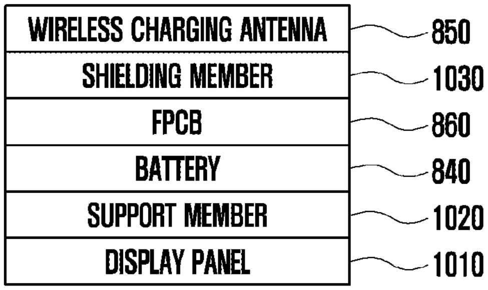
FIG. 10 is a diagram illustrating a section of an electronic device according to various embodiments.

FIG. 10 is a diagram illustrating a section of an electronic device 101 according to various embodiments.

The electronic device 101 may include a display panel 1010, a support member 1020, a battery 840, an FPCB 860, a shielding member (e.g., including an electromagnetic shield comprising an electromagnetic shielding material) 1030, and/or a wireless charging antenna 850.

According to various embodiments, the electronic device 101 may include the display panel 1010, the support member 1020 (e.g., the first support member 611 in FIG. 6), the battery 840, the FPCB 860, the shielding member 1030, and/or the wireless charging antenna 850 (e.g., the antenna 670 in FIG. 6) which are sequentially arranged in a direction from the front (e.g., the front surface 110A in FIG. 4) to the rear (e.g., the rear surface 110B in FIG. 5). For another example, arrangement positions of the display panel 1010, the support member 1020, the battery 840, the FPCB 860, the shielding member 1030, and/or the wireless charging antenna 850 may be changed. The shielding member 1030 may be disposed between the FPCB 860 and the wireless charging antenna 850 and may prevent and/or reduce an influence on the FPCB 860 from noise caused by an electromagnetic force and/or an operating frequency of the wireless charging antenna 850. The shielding member 1030 may block noise caused by an electromagnetic force and/or an operating frequency of the wireless charging antenna 850 and may include an area substantially the same as a pattern area of the wireless charging antenna 850. For example, the shielding member 1030 may have a shape corresponding to a pattern of the wireless charging antenna 850.

Figure 11:
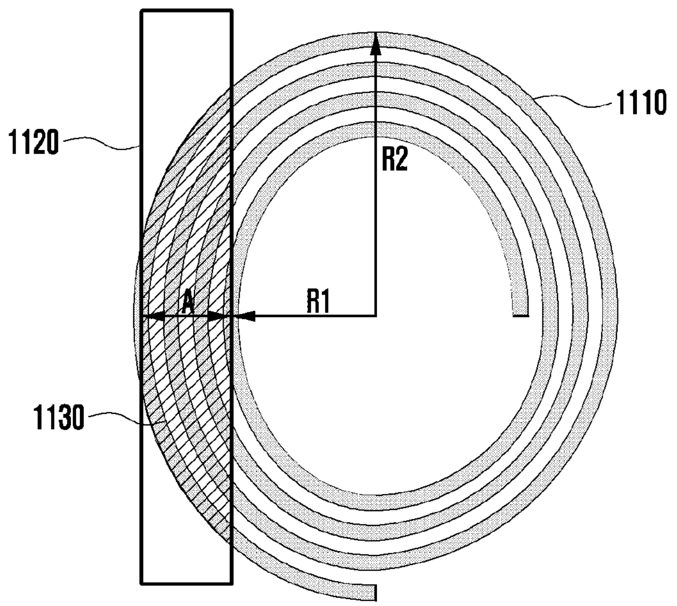
FIG. 11 is a diagram illustrating a wireless charging antenna and an FPCB according to various embodiments.

FIG. 11 is a diagram illustrating an example wireless charging antenna 1110 and an FPCB 1120 according to various embodiments.

According to various embodiments, the wireless charging antenna 1110 (e.g., the wireless charging antenna 850 in FIG. 8 and FIG. 9) may include a circular coil including a pattern having an inner radius of R1 and an outer radius of R2.

A loop of the coil of the wireless charging antenna 1110 may be arranged between the inner radius R1 and the outer radius R2. The wireless charging antenna 1110 may include a pattern arranged between the inner radius R1 and the outer radius R2.

In various embodiments, the wireless charging antenna 1110 may include a pattern formed so that the loop of the coil has a width of substantially the outer radius R2 without an inner void. The width of the pattern of the wireless charging antenna 1110 may correspond to the outer radius R2. For example, the pattern of the wireless charging antenna 1110 may include a loop shape of a coil.

The width of the pattern of the wireless charging antenna 1110 may have a size obtained by subtracting the inner radius R1 from the outer radius R2.

According to various embodiments, the FPCB 1120 (e.g., the FPCB 860 in FIG. 8 and FIG. 9) may have, for example, a linear shape. For example, the FPCB 1120 may have a rectangular shape having a width of a first length A.

Referring to FIG. 8 to FIG. 10, the wireless charging antenna 1110 and the FPCB 1120 may be arranged to be stacked on each other. For another example, a shielding member (e.g., the shielding member 1030 in FIG. 10) may be additionally stacked between the wireless charging antenna 1110 and the FPCB 1120.

According to various embodiments, the first length A of the FPCB 1120 may be less than or equal to the width (R2-R1) of the pattern of the wireless charging antenna 1110.

According to various embodiments, at least a part of the FPCB 1120 may be arranged to be stacked on the wireless charging antenna 1110 while overlapping at least a part of the pattern of the wireless charging antenna 1110. An area 1130 in which at least a part of the FPCB 1120 overlaps at least a part of the pattern of the wireless charging antenna 1110 may be arranged not to deviate the pattern of the wireless charging antenna 1110. For example, when viewed from the rear (e.g., the rear surface 110B in FIG. 5) of the electronic device 101, at least part of the FPCB 1120 overlapped with the pattern of the wireless charging antenna 1110 may be arranged to be located inside the pattern of the wireless charging antenna 1110.

According to various embodiments, the FPCB 1120 having a width of the first length A may be arranged to be stacked on the wireless charging antenna 1110 between the inner radius R1 and the outer radius R2 of the wireless charging antenna 1110.

According to various embodiments, an area 1130 of the FPCB 1120 overlapping at least a part of the pattern of the wireless charging antenna 1110 may be arranged to be stacked on the wireless charging antenna 1110 between the inner radius R1 and the outer radius R2 of the wireless charging antenna 1110.

According to various embodiments, the FPCB 1120 may be disposed at a position farther than the wireless charging antenna 1110 from a rear plate (e.g., the rear plate 680 in FIG. 6). For another example, a conductive line included in the FPCB 1120 may be arranged to be substantially parallel to the pattern of the wireless charging antenna 1110.

Figure 12:
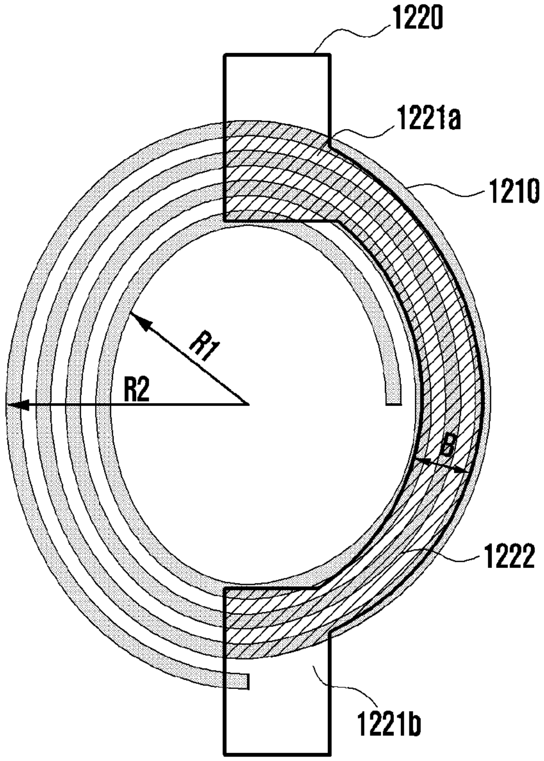
FIG. 12 is a diagram illustrating a wireless charging antenna and an FPCB according to various embodiments.

FIG. 12 is a diagram illustrating an example wireless charging antenna 1210 and a FPCB 1220 according to various embodiments.

According to various embodiments, the wireless charging antenna 1210 (e.g., the wireless charging antenna 850 in FIG. 8 and FIG. 9) may include a circular coil including a pattern having an inner radius of R1 and an outer radius of R2.

A loop of the coil included in the wireless charging antenna 1210 may be arranged between the inner radius R1 and the outer radius R2. The wireless charging antenna 1210 may include a pattern arranged between the inner radius R1 and the outer radius R2.

In various embodiments, the wireless charging antenna 1210 may include a pattern formed so that the loop of the coil has a width of substantially the outer radius R2 without an inner void. The width of the pattern of the wireless charging antenna 1210 may correspond to the outer radius R2. For example, the pattern of the wireless charging antenna 1210 may include a loop shape of a coil.

Referring to FIG. 8 to FIG. 10, the wireless charging antenna 1210 and the FPCB 1220 may be arranged to be stacked on each other. For another example, a shielding member (e.g., the shielding member 1030 in FIG. 10) may be additionally stacked between the wireless charging antenna 1210 and the FPCB 1220.

According to various embodiments, the width of the pattern of the wireless charging antenna 1210 may have a size obtained by subtracting the inner radius R1 from the outer radius R2.

According to various embodiments, the FPCB 1220 may include a first terminal area 1221*a*, a second terminal area 1221*b*, and a connection area 1222. The connection area 1222 may connect the first terminal area 1221*a* and the second terminal area 1221*b*. The first terminal area 1221*a* and the second terminal area 1221*b* have a rectangular shape and at least a part thereof may overlap the pattern of the wireless charging antenna 1210.

According to various embodiments, the connection area 1222 may have a width of a second length B. For example, when viewed from the rear (e.g., the rear surface 110B in FIG. 5) of the electronic device 101, the connection area 1222 may be arranged to overlap the pattern of the wireless charging antenna 1210. For example, the connection area 1222 may have a shape having at least a part corresponding to a shape of the pattern of the wireless charging antenna 1210. At least a part of the connection area 1222 may include a curved shape. The second length B of the connection area 1222 may be substantially less than or equal to the width (R2-R1) of the pattern of the wireless charging antenna 1110.

According to various embodiments, the connection 1222 may be arranged to overlap at least a part of the pattern of the wireless charging antenna 1210.

According to various embodiments, the connection 1222 may be arranged to overlap at least a part of the pattern of the wireless charging antenna 1210 and to be stacked on the wireless charging antenna 1210 so as not to deviate the pattern of the wireless charging antenna 1110.

According to various embodiments, the connection area 1222 having a width of the second length B may be arranged to be stacked on the wireless charging antenna 1210 between the inner radius R1 and the outer radius R2 of the pattern of the wireless charging antenna 1210.

At least a part of the FPCB 1220 may be arranged to be stacked on the wireless charging antenna 1210 between the inner radius R1 and the outer radius R2 of the pattern of the wireless charging antenna 1210.

According to various embodiments, the FPCB 1220 may be disposed at a position farther than the wireless charging antenna 1210 from a rear plate (e.g., the rear plate 680 in FIG. 6). For another example, a conductive line included in the FPCB 1220 may be arranged to be substantially parallel to the pattern of the wireless charging antenna 1210.

Figure 13:
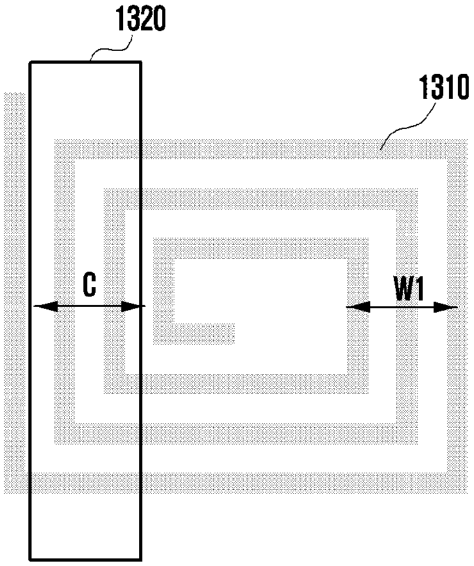
FIG. 13 is a diagram illustrating a wireless charging antenna and an FPCB according to various embodiments.

FIG. 13 is a diagram illustrating an example wireless charging antenna 1310 and a FPCB 1320 according to various embodiments of the disclosure.

The wireless charging antenna 1310 (e.g., the wireless charging antenna 850 in FIG. 8 and FIG. 9) may be a quadrangular coil of which a pattern has a width of a third length W1.

In various embodiments, the wireless charging antenna 1310 (e.g., the wireless charging antenna 850 in FIG. 8 and FIG. 9) may be a quadrangular coil of which a pattern has a width of a third length W1 without a void.

In various embodiments, the FPCB 1320 (e.g., the FPCB 860 in FIG. 8 and FIG. 9) may have a linear shape. The FPCB 1320 may have a rectangular shape having a width of a fourth length C.

Referring to FIG. 8 to FIG. 10, the wireless charging antenna 1310 and the FPCB 1320 may be arranged to be stacked on each other. For another example, a shielding member (e.g., the shielding member 1030 in FIG. 10) may be additionally stacked between the wireless charging antenna 1310 and the FPCB 1320.

According to various embodiments, the FPCB 1320 may be disposed at a position farther than the wireless charging antenna 1310 from a rear plate (e.g., the rear plate 680 in FIG. 6). For another example, a conductive line included in the FPCB 1320 may be arranged to be substantially parallel to the pattern of the wireless charging antenna 1310.

In various embodiments, the fourth length C of the FPCB 1320 may be substantially less than or equal to the third length W1 of the width of the pattern of the wireless charging antenna 1310.

In various embodiments, at least a part of the FPCB 1320 may be arranged to be stacked on the wireless charging antenna 1310 while overlapping at least a part of the pattern of the wireless charging antenna 1310.

In various embodiments, an area 1330 in which at least a part of the FPCB 1320 overlaps at least a part of the pattern of the wireless charging antenna 1310 may be arranged not to deviate the pattern of the wireless charging antenna 1310.

In various embodiments, the FPCB 1320 having a width of the fourth length C may be arranged to be stacked on the wireless charging antenna 1310 within a width (e.g., the third length W1) of the pattern of the wireless charging antenna 1310.

Figure 14:
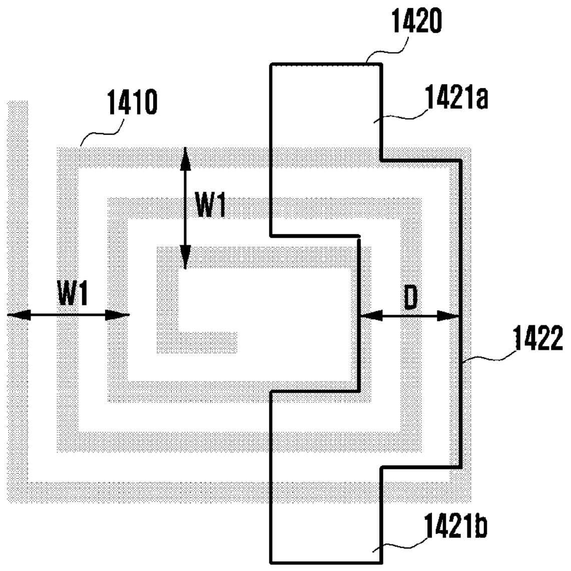
FIG. 14 is a diagram illustrating a wireless charging antenna and an FPCB according to various embodiments.

FIG. 14 is a diagram illustrating an example wireless charging antenna 1410 and a FPCB 1420 according to various embodiments.

In various embodiments, the wireless charging antenna 1410 (e.g., the wireless charging antenna 850 in FIG. 8 and FIG. 9) may be a quadrangular coil of which a pattern has a width of a third length W1.

Referring to FIG. 8 to FIG. 10, the wireless charging antenna 1410 and the FPCB 1420 may be arranged to be stacked on each other. For another example, a shielding member (e.g., the shielding member 1030 in FIG. 10) may be additionally stacked between the wireless charging antenna 1410 and the FPCB 1420.

In various embodiments, the FPCB 1420 may include a first terminal area 1421*a*, a second terminal area 1421*b*, and a connection area 1422. The connection area 1222 may connect the first terminal area 1221*a* and the second terminal area 1221*b*. The first terminal area 1421*a* and the second terminal area 1421*b* have a rectangular shape and at least a part thereof may overlap the pattern of the wireless charging antenna 1410.

In various embodiments, the connection area 1422 may have a linear shape having a width of a fifth length D. The connection 1422 may have a shape having at least a part corresponding to a shape of the pattern of the wireless charging antenna 1410. The fifth length D of the connection area 1422 may be substantially less than or equal to the width (the third length W1) of the pattern of the wireless charging antenna 1410.

In various embodiments, the connection area 1422 may be arranged to overlap at least a part of the pattern of the wireless charging antenna 1410.

In various embodiments, the connection area 1422 may be arranged to overlap at least a part of the pattern of the wireless charging antenna 1410 and to be stacked on the wireless charging antenna 1410 so as not to deviate the pattern of the wireless charging antenna 1410.

In various embodiments, the connection area 1422 having a width of the fifth length D may be arranged to be stacked on the wireless charging antenna 1410 between patterns of the wireless charging antenna 1410.

In various embodiments, at least a part of the FPCB 1420 may be arranged to be stacked on the wireless charging antenna 1410 between patterns of the wireless charging antenna 1410.

According to various embodiments, the FPCB 1420 may be disposed at a position farther than the wireless charging antenna 1410 from a rear plate (e.g., the rear plate 680 in FIG. 6). For another example, a conductive line included in the FPCB 1420 may be arranged to be substantially parallel to the pattern of the wireless charging antenna 1410.

Figure 15:
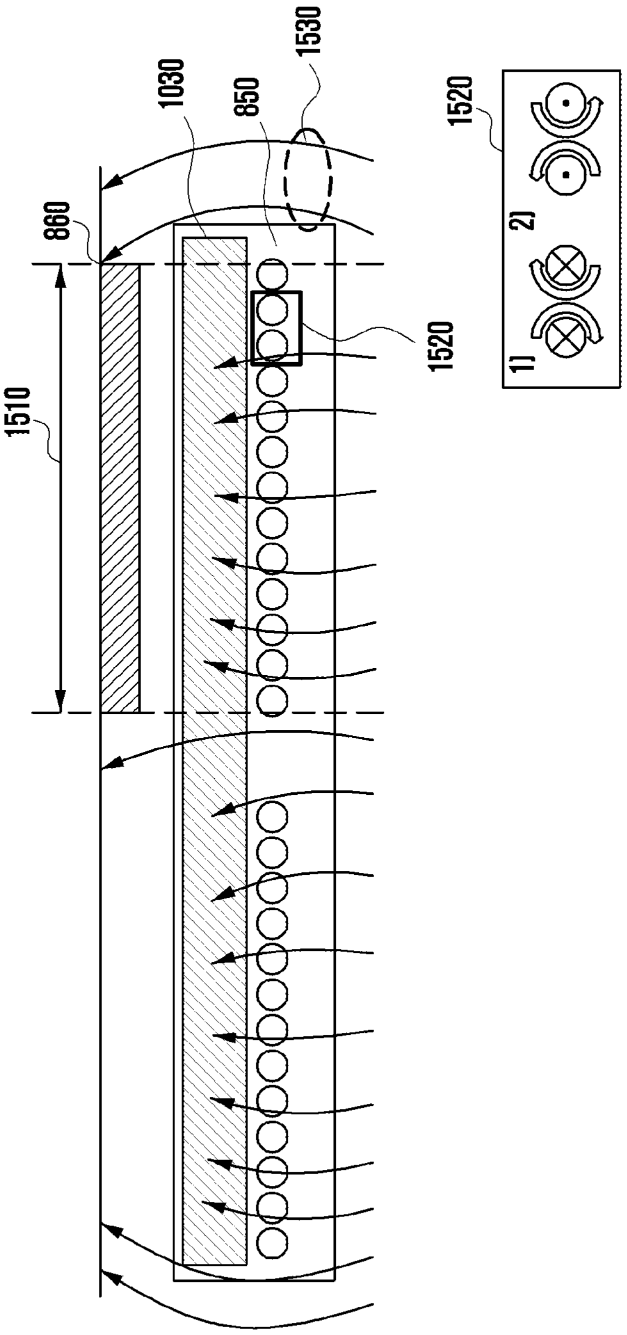
FIG. 15 is a diagram illustrating a magnetic flux of power transmission/reception using a wireless charging antenna according to various embodiments.

FIG. 15 is a diagram illustrating an example magnetic flux of power transmission/reception using a wireless charging antenna 850 according to various embodiments.

In various embodiments, the wireless charging antenna 850 may be identical or similar to, for example, the wireless charging antenna 1110 in FIG. 11, the wireless charging antenna 1210 in FIG. 12, the wireless charging antenna 1310 in FIG. 13, or the wireless charging antenna 1410 in FIG. 14.

In various embodiments, the FPCB 860 may be identical or similar to the FPCB 1120 in FIG. 11, the FPCB 1220 in FIG. 12, the FPCB 1320 in FIG. 13, or the FPCB 1420 in FIG. 14.

In various embodiments, in case that a current is induced on a pattern of the wireless charging antenna 850, a magnetic field and/or magnetic flux may be generated around a conductive wire. Referring to 1520, in the wireless charging antenna 850, the magnetic field around the current-induced conductive wire may counterbalance a magnetic field and/or magnetic flux generated by the wireless charging antenna 850 due to an effect of an abutted conductive wire.

In various embodiments, the shielding member 1030 corresponding to a pattern area of the wireless charging antenna 850 may block or reduce an influence of the magnetic field and/or magnetic flux of the current-induced conductive wire of the wireless charging antenna 850 to the FPCB 860.

In various embodiments, despite of the shielding member 1030, a magnetic field and/or magnetic flux generated on the wireless charging antenna 850 and a magnetic field and/or magnetic flux 1530 generated on a periphery of the pattern of the wireless charging antenna 850 may affect the FPCB 860. Here, arrangement of the FPCB 860 within a width range 1510 of the pattern of the wireless charging antenna 850 may reduce an influence of the magnetic field and/or magnetic flux of the current-induced conductive wire of the wireless charging antenna 850 to the FPCB 860.

In various embodiments, within a width range 1510 of the pattern of the wireless charging antenna 850, the FPCB 860 may include a conductive wire disposed in a direction parallel with and/or perpendicular to the pattern of the wireless charging antenna 850.

In various embodiments, for example, in case that the pattern of the wireless charging antenna 850 is wound in the same direction, the FPCB 860 may reduce an influence of the magnetic field and/or magnetic flux around the current-induced conductive wire of the wireless charging antenna 850 to the FPCB 860 by arranging the conductive wire of the FPCB 860 in a direction parallel with the pattern of the wireless charging antenna 850.

Referring to FIG. 14, a conductive wire of the connection area 1422 may be arranged in a direction parallel with the pattern of the wireless charging antenna 1420 in a section in which the pattern of the wireless charging antenna 1420 is wound in the same direction.

For example, in case that an upper terminal and an lower terminal of the pattern of the wireless charging antenna 850 are wound in different directions, the FPCB 860 may reduce an influence of the magnetic field and/or magnetic flux around the current-induced conductive wire of the wireless charging antenna 850 to the FPCB 860 by arranging the conductive wire of the FPCB 860 in a direction perpendicular to the pattern of the wireless charging antenna 850.

Referring to FIG. 14, a conductive wire of the first terminal area 1421*a* and/or the second terminal area 1421*b* may be arranged in a direction perpendicular to the pattern of the wireless charging antenna 1420 in a section in which the upper terminal and the lower terminal of the pattern of the wireless charging antenna 1420 are wound in different directions.

Flickering improvement effects of the display module 160 according to arrangement structure of the wireless charging antenna 850 and the FPCB 860 according to various embodiments of the disclosure are shown in [Table 1] below.

TABLE 1

| | | Conventional | | | The disclosure | | |
|---|---|---|---|---|---|---|---|
| Charging voltage | | 9 V | | 5 V | 9 V | | 5 V |
| Driving frequency | | 60 | | | 60 | | |
| Porch(H) | | 2400 | | | 2400 | | |
| Scan frequency (KHz) | | 32 | | | 32 | | |
| Wireless charging device | | First model | | Second model | First model | | Second model |
| Display module flickering magnitude in the vertical direction | Ping operation | 3 | 3 | 2 | 3 | 3 | 1 |
| | Charging operation | 3 | 2 | 1 | 1 | 0 | 0 |
| Display module flickering magnitude in the horizontal direction | Ping operation | 3 | 3 | 2 | 3 | 3 | 1 |
| | Charging operation | 3 | 3 | 1 | 1 | 0 | 0 |

In Table 1, there are 5 to 0 levels of flickering magnitude of the display module 160, the closer to 5, the greater the flickering magnitude of the display module 160, and the closer to 0, the lower the flickering magnitude of the display module 160. For example, the flickering magnitude level may be a subjective value. For example, the flickering magnitude may vary depending on a person observing the display module 160. Referring to Table 1, the electronic device 101 including the arrangement structure of the wireless charging antenna 850 and the FPCB 860 shows remarkable improvement in flickering magnitude in that in a charging operation, flickering magnitude of the display module 160 is 0 and/or 1 level compared to a case not including the arrangement structure of the wireless charging antenna 850 and the FPCB 860 according to various embodiments of the disclosure and having a flickering magnitude of 3 to 1 level.

The electronic device according to various embodiments disclosed herein may be one of various types of electronic devices. The electronic devices may include, for example, a portable communication device (e.g., a smart phone), a computer device, a portable multimedia device, a portable medical device, a camera, a wearable device, a home appliance, or the like. The electronic device according to embodiments of the disclosure is not limited to those described above.

It should be appreciated that various embodiments of the disclosure and the terms used therein are not intended to limit the technological features set forth herein to particular embodiments and include various changes, equivalents, or alternatives for a corresponding embodiment. With regard to the description of the drawings, similar reference numerals may be used to designate similar or relevant elements. A singular form of a noun corresponding to an item may include one or more of the items, unless the relevant context clearly indicates otherwise. As used herein, each of such phrases as "A or B," "at least one of A and B," "at least one of A or B," "A, B, or C," "at least one of A, B, and C," and "at least one of A, B, or C," may include all possible combinations of the items enumerated together in a corresponding one of the phrases. As used herein, such terms as "a first", "a second", "the first", and "the second" may be used to simply distinguish a corresponding element from another, and does not limit the elements in other aspect (e.g., importance or order). It is to be understood that if an element (e.g., a first element) is referred to, with or without the term "operatively" or "communicatively", as "coupled with/to" or "connected with/to" another element (e.g., a second element), the element may be coupled/connected with/to the other element directly (e.g., wiredly), wirelessly, or via a third element.

As used herein, the term "module" may include a unit implemented in hardware, software, or firmware, or any combination thereof, and may be interchangeably used with other terms, for example, "logic," "logic block," "component," or "circuit". The "module" may be a minimum unit of a single integrated component adapted to perform one or more functions, or a part thereof. For example, according to an embodiment, the "module" may be implemented in the form of an application-specific integrated circuit (ASIC).

Various embodiments as set forth herein may be implemented as software (e.g., the program 140) including one or more instructions that are stored in a storage medium (e.g., the internal memory 136 or external memory 138) that is readable by a machine (e.g., the electronic device 101). For example, a processor (e.g., the processor 120) of the machine (e.g., the electronic device 101) may invoke at least one of the one or more instructions stored in the storage medium, and execute it. This allows the machine to be operated to perform at least one function according to the at least one instruction invoked. The one or more instructions may include a code generated by a compiler or a code executable by an interpreter. The machine-readable storage medium may be provided in the form of a non-transitory storage medium. Wherein, the "non-transitory" storage medium is a tangible device, and may not include a signal (e.g., an electromagnetic wave), but this term does not differentiate between where data is semi-permanently stored in the storage medium and where the data is temporarily stored in the storage medium.

According to an embodiment, a method according to various embodiments of the disclosure may be included and provided in a computer program product. The computer program product may be traded as a product between a seller and a buyer. The computer program product may be distributed in the form of a machine-readable storage medium (e.g., compact disc read only memory (CD-ROM)), or be distributed (e.g., downloaded or uploaded) online via an application store (e.g., Play Store™), or between two user devices (e.g., smart phones) directly. If distributed online, at least part of the computer program product may be temporarily generated or at least temporarily stored in the machine-readable storage medium, such as memory of the manufacturer's server, a server of the application store, or a relay server.

According to various embodiments, each element (e.g., a module or a program) of the above-described elements may include a single entity or multiple entities. According to various embodiments, one or more of the above-described elements may be omitted, or one or more other elements may be added. Alternatively or additionally, a plurality of elements (e.g., modules or programs) may be integrated into a single element. In such a case, according to various embodiments, the integrated element may still perform one or more functions of each of the plurality of elements in the same or similar manner as they are performed by a corresponding one of the plurality of elements before the integration. According to various embodiments, operations performed by the module, the program, or another element may be carried out sequentially, in parallel, repeatedly, or heuristically, or one or more of the operations may be executed in a different order or omitted, or one or more other operations may be added.

While the disclosure has been illustrated and described with reference to various example embodiments, it will be understood that the various example embodiments are intended to be illustrative, not limiting. It will be further understood by those skilled in the art that various changes in form and detail may be made without departing from the true spirit and full scope of the disclosure, including the appended claims and their equivalents. It will also be understood that any of the embodiment(s) described herein may be used in conjunction with any other embodiment(s) described herein.

What is claimed is:

1. An electronic device capable of wireless charging, comprising:

a first circuit board;

a second circuit board;

a battery;

a flexible printed circuit board (FPCB) configured to electrically connect the first circuit board and the second circuit board to each other;

a wireless charging antenna; and a shielding member comprising an electromagnetic shielding material, wherein the wireless charging antenna, the shielding member, and the FPCB are vertically stacked on different layers such that the shielding member is interposed between the wireless charging antenna and the FPCB, wherein at least a part of the FPCB is arranged to at least partially overlap a width range of a conductive pattern of the wireless charging antenna, and wherein at least one conductor of the FPCB extends in a direction parallel to and/or perpendicular to the conductive pattern of the wireless charging antenna.

2. The electronic device of claim 1, wherein the shielding member is configured to substantially block noise caused by an electromagnetic force and/or an operating frequency of the wireless charging antenna and corresponds to the pattern of the wireless charging antenna.

3. The electronic device of claim 1, wherein the wireless charging antenna comprises a coil having a circular pattern, and wherein the circular pattern has a width of a first length.

4. The electronic device of claim 3, wherein the FPCB has a rectangular shape and a width of a second length less than or equal to the first length.

5. The electronic device of claim 4, wherein the FPCB comprises a partial area included in the width range of the circular pattern and is vertically stacked with and at least partially overlaps the wireless charging antenna, with the shielding member interposed therebetween.

6. The electronic device of claim 3, wherein the FPCB comprises:

a first terminal area;

a second terminal area; and a connection area configured to connect the first terminal area and the second terminal area, and wherein the connection area has a width of a third length less than or equal to the first length and a curved shape corresponding to the circular pattern.

7. The electronic device of claim 6, wherein the connection area is included in the width range of the circular pattern and is vertically stacked with and at least partially overlaps the wireless charging antenna, with the shielding member interposed therebetween.

8. The electronic device of claim 6, wherein the first terminal area and the second terminal area have a quadrangular shape and are vertically stacked with and at least partially overlap the wireless charging antenna, with the shielding member interposed therebetween.

9. The electronic device of claim 1, wherein the wireless charging antenna comprises a coil having a quadrangular pattern, and wherein the quadrangular pattern has a width of a fourth length.

10. The electronic device of claim 9, wherein the FPCB has a rectangular shape and a width of a fifth length less than or equal to the fourth length.

11. The electronic device of claim 10, wherein the FPCB comprises a partial area included in the width range of the quadrangular pattern and is vertically stacked with and at least partially overlaps the wireless charging antenna, with the shielding member interposed therebetween.

12. The electronic device of claim 9, wherein the FPCB comprises:

a first terminal area;

a second terminal area; and a connection area configured to connect the first terminal area and the second terminal area, and wherein the connection area has a width of a sixth length less than or equal to the fourth length and a shape corresponding to the quadrangular pattern.

13. The electronic device of claim 12, wherein the connection area is included in the width range of the quadrangular pattern and is vertically stacked with and at least partially overlaps the wireless charging antenna, with the shielding member interposed therebetween.

14. The electronic device of claim 12, wherein the first terminal area and the second terminal area have a quadrangular shape and are vertically stacked with and at least partially overlap the wireless charging antenna, with the shielding member interposed therebetween.

15. The electronic device of claim 1, wherein the first circuit board is a main board, wherein the second circuit board is a display printed circuit board (PCB), wherein in the FPCB, electric connection is made in direction from the first circuit board to the second circuit board and/or from the second circuit board to the first circuit board, and wherein the wireless charging antenna is configured to: transmit and/or receive power in a frequency band corresponding to the wireless power consortium (WPC) standard, wirelessly receive power from the outside, and transmit power to the battery.

* * * * *